US012609713B2

(12) United States Patent
Ren et al.

(10) Patent No.: US 12,609,713 B2
(45) Date of Patent: Apr. 21, 2026

(54) METHODS AND SYSTEMS FOR SYNCHRONIZING AN ANALOG TO DIGITAL CONVERTER

(71) Applicant: Analog Devices International Unlimited Company, Limerick (IE)

(72) Inventors: Naiqian Ren, Limerick (IE); Adrian Sherry, Raheen (IE); Anthony O'Shaughnessy, Glounthaune (IE); Andrew David Alsup, Albuquerque, NM (US)

(73) Assignee: Analog Devices International Unlimited Company, Limerick (IE)

( * ) Notice: Subject to any disclaimer, the term of this patent is extended or adjusted under 35 U.S.C. 154(b) by 102 days.

(21) Appl. No.: 18/641,803

(22) Filed: Apr. 22, 2024

(65) Prior Publication Data

US 2025/0330192 A1 Oct. 23, 2025

(51) Int. Cl.
*H03M 1/12* (2006.01)
(52) U.S. Cl.
CPC ........... *H03M 1/1255* (2013.01); *H03M 1/12* (2013.01)

(58) Field of Classification Search
CPC .. H03M 1/121; H03M 1/1215; H03M 1/1255; H03M 1/12
USPC ......................................... 341/122, 123, 155
See application file for complete search history.

(56) References Cited

U.S. PATENT DOCUMENTS 9,893,877 B2   2/2018  Anvekar et al.
11,115,040 B1 *  9/2021  Xu ........................ H03M 1/121
2023/0417799 A1 * 12/2023  Park .................... H03M 1/1215

* cited by examiner

*Primary Examiner* — Khai M Nguyen
(74) *Attorney, Agent, or Firm* — Schwegman Lundberg & Woessner, P.A.

(57) ABSTRACT

A method for synchronizing an analog-to-digital converter, ADC, the method comprising: stopping, by a processor, a master clock signal to the ADC to pause sampling of the ADC, the master clock signal being supplied by an external master clock to the ADC; detecting, by the ADC, that a synchronization event has occurred whilst the master clock is stopped; restarting, by the processor, the master clock signal to the ADC; resetting, by the ADC, an internal filter at a time that is synchronous with the master clock; and resuming, by the ADC, sampling in response to resetting the internal filter of the ADC.

20 Claims, 15 Drawing Sheets

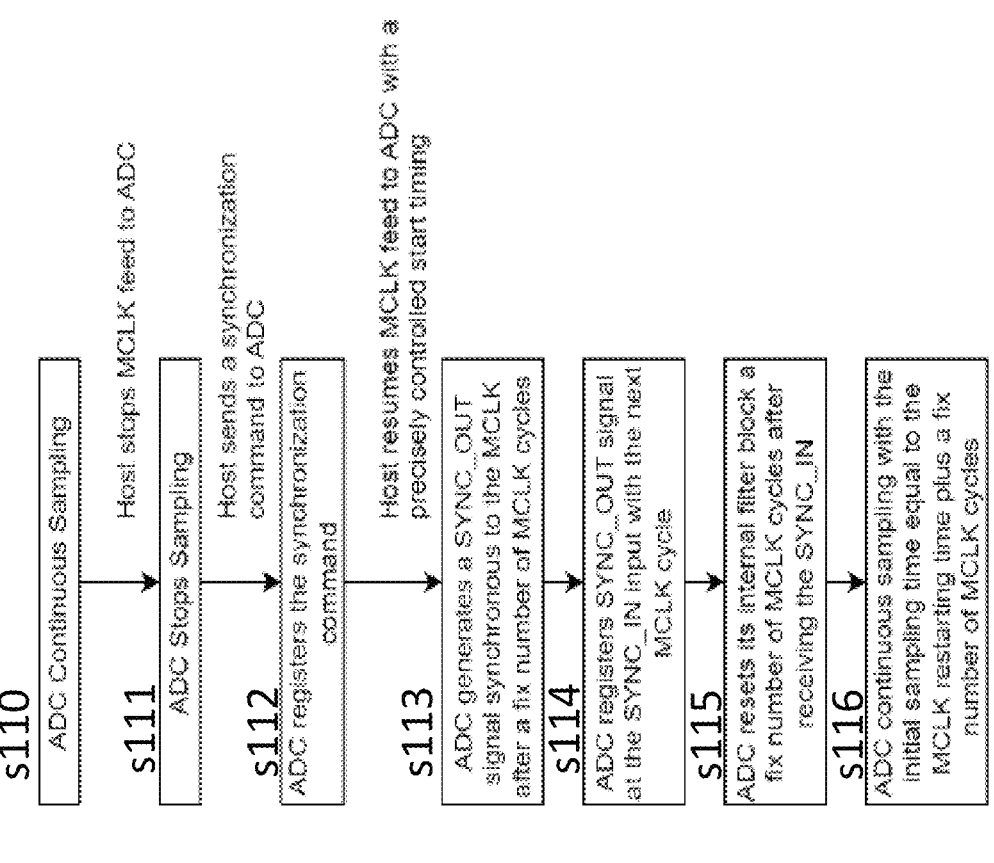

11 s110 — ADC Continuous Sampling

Host stops MCLK feed to ADC s111 — ADC Stops Sampling

Host sends a synchronization command to ADC s112 — ADC registers the synchronization command Host resumes MCLK feed to ADC with a precisely controlled start timing s113 — ADC generates a SYNC_OUT signal synchronous to the MCLK after a fix number of MCLK cycles s114 — ADC registers SYNC_OUT signal at the SYNC_IN input with the next MCLK cycle s115 — ADC resets its internal filter block a fix number of MCLK cycles after receiving the SYNC_IN s116 — ADC continuous sampling with the initial sampling time equal to the MCLK restarting time plus a fix number of MCLK cycles

FIG. 11

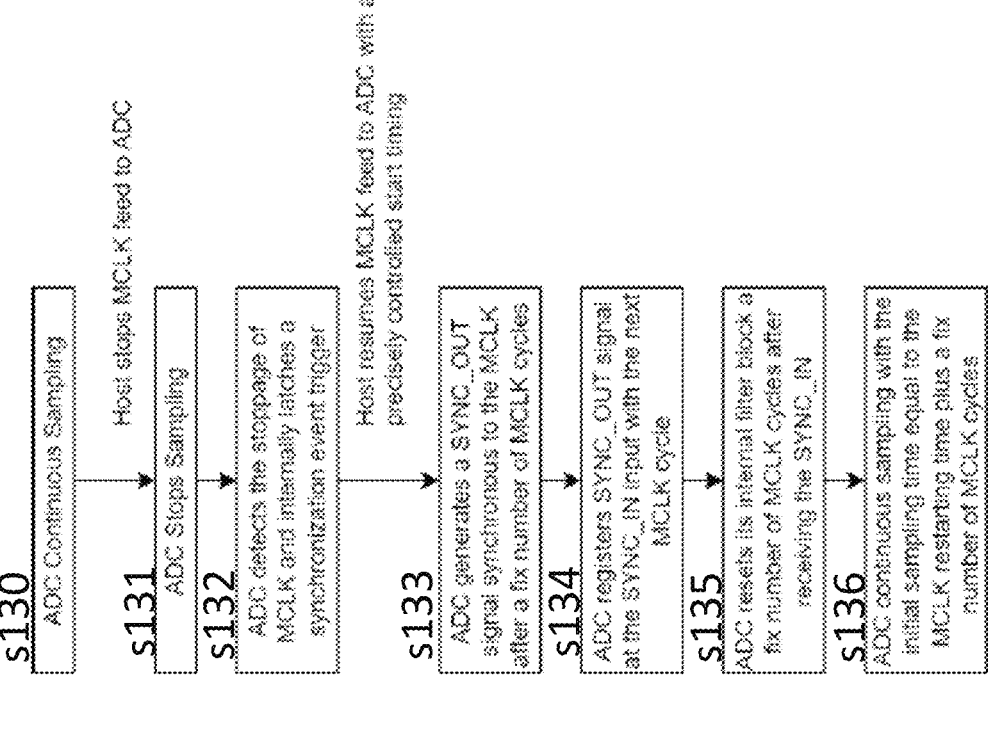

13 s130
ADC Continuous Sampling

Host stops MCLK feed to ADC s131
ADC Stops Sampling s132
ADC detects the stoppage of MCLK and internally latches a synchronization event trigger Host resumes MCLK feed to ADC with a precisely controlled start timing s133
ADC generates a SYNC_OUT signal synchronous to the MCLK after a fix number of MCLK cycles s134
ADC registers SYNC_IN input at the SYNC_IN input with the next MCLK cycle s135
ADC resets its internal filter block a fix number of MCLK cycles after receiving the SYNC_IN s136
ADC continuous sampling with the initial sampling time equal to the MCLK restarting time plus a fix number of MCLK cycles

FIG. 13

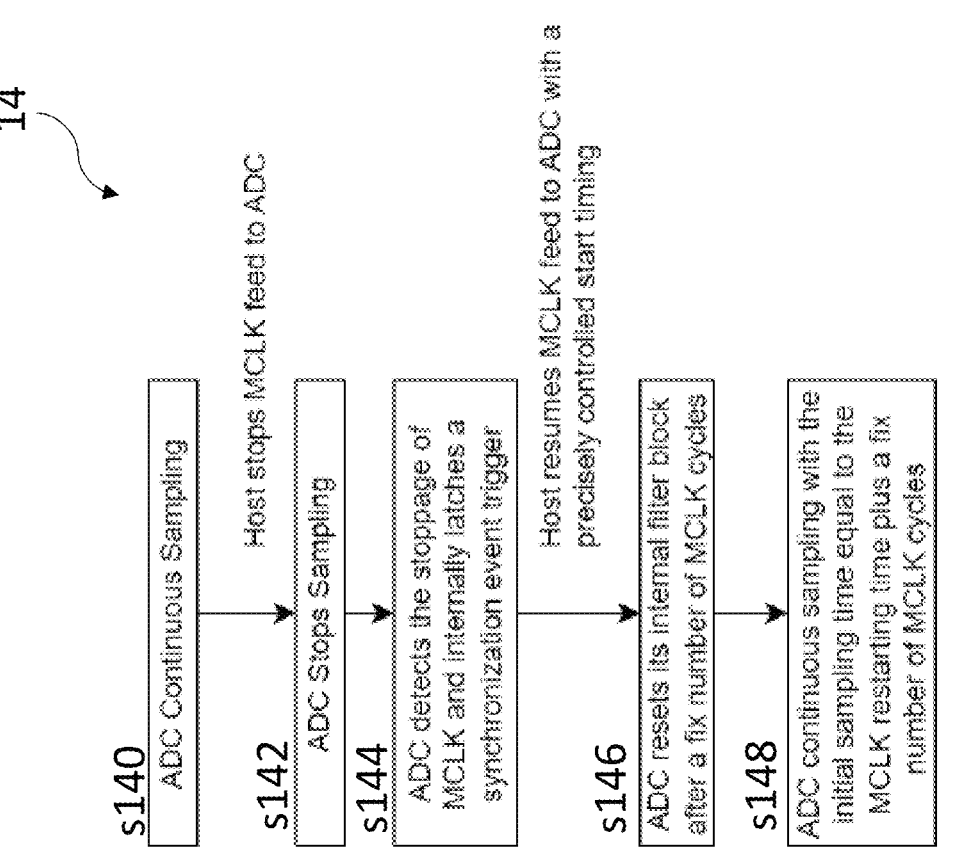

14 s140 ADC Continuous Sampling

Host stops MCLK feed to ADC s142 ADC Stops Sampling s144 ADC detects the stoppage of MCLK and internally latches a synchronization event trigger Host resumes MCLK feed to ADC with a precisely controlled start timing s146 ADC resets its internal filter block after a fix number of MCLK cycles s148 ADC continuous sampling with the initial sampling time equal to the MCLK restarting time plus a fix number of MCLK cycles

FIG. 14

METHODS AND SYSTEMS FOR SYNCHRONIZING AN ANALOG TO DIGITAL CONVERTER

FIELD

The present disclosure generally relates to methods and systems for synchronizing an analog to digital converter (ADC) and synchronizing two or more ADCs. More specifically, but not exclusively, the present disclosure relates to methods and systems for synchronizing an ADC, or synchronizing of two or more ADCs, by stopping and starting a single master clock signal.

BACKGROUND

Multi-channel instruments typically require simultaneous sampling to take place and use oversampling ADCs that sample the input multiple times to produce one data output, which result in a lower frequency output compared to the sampling frequency. If there is no synchronization of the output, due to decimation, the various channels of the multi-channel instrument could produce outputs at very different phases. To achieve accurate and reliable data acquisition in multi-channel, high speed sampling applications, ADC synchronization at the output is used and it is desirable to have precise timing relationships between output signals. Moreover, there are specific IEEE requirements and standards for synchronization schemes within some devices and instruments.

However, when a plurality of ADCs are involved, the ADC synchronization process is not simple and can require complex hardware circuitry. The hardware circuitry can often include multiple input/output arrangements and multiple system clocks.

Therefore, there is a need for an improved method and system for operating an ADC, or two or more ADCs, to ensure adequate synchronization.

SUMMARY OF THE DISCLOSURE

In ADC systems, the ADCs continuously perform sampling i.e. sampling the input and producing an output. Particularly, in oversampling ADC systems, the ADCs takes samples of the input multiple times in order to produce one data output. In many instances, multiple ADCs share the same master clock signal and therefore sample the input simultaneously. However, they may not produce the output at the same time. This creates a synchronization issue between the multiple ADCs in system, and can lead to phase error in the measurement.

In the context of multi-channel instruments, for example, the instruments utilize oversampling ADCs that sample input values multiple times to produce a single data output. This means that the multi-channel instruments are at risk of increased phase error between the outputs of the various instrument channels. This is also a particular problem in systems and devices where components that require synchronized sampling are geographically located at positions far apart from each other. Thus, there is a need to synchronize the sampling of individual ADCs within a system with respect to a time reference to ensure that the phase error is reduced. In turn enabling the operation or synchronization of an ADC system with precision timing relationships between outputs.

The present disclosure relates to method for operating and synchronizing an ADC system. The ADC system may comprise a single ADC or multiple ADCs. The present disclosure provides a method including stopping the master clock of the ADC system such that the ADC stops normal operation e.g. the sampling of an input signal. The ADC system then receives or detects information that suggests the ADC should perform synchronization to a time reference. Upon restarting the master clock, the internal circuitry of the ADC triggers the resumption of the ADC sampling. The ADC sampling resumption may therefore be predictably restarted at a deterministic time after the restarting of the master clock. This approach may be used to ensure the predictable restarting of the ADC sampling relative to a time reference, for an individual ADC or multiple ADCs. Thus, the present disclosure seeks to provide methods and systems for enabling the operation or synchronization of an ADC system with precision timing relationships between outputs.

Further, the present disclosure provides methods and systems for synchronizing an ADC, or two or more ADCs, such that they are time reference synchronized in manner that is robust, reliable, and efficient. In other words, the methods and systems seek to provide ADC time reference synchronization with significantly reduced phase error in the output, reduced hardware and software complexity, minimal hardware footprint, and high predictability of synchronization.

The present disclosure provides an ADC system and a multiple ADC system consisting of two or more ADCs. In both systems, the system may comprise at least one ADC, a processor and a master clock. The master clock is a device external to the one or more ADCs. In the system with multiple ADCs, the ADCs are arranged such that all of the ADCs share a master clock. In conjunction with the ADC system, the present disclosure provides a method of operating the ADC system. The method includes stopping, by a processor the master clock of the ADC(s) and pausing sampling, then triggering or detecting a synchronization event on the ADC(s) whilst the master clock is stopped. Next, the method restarts the master clock of the ADC(s). Upon restart of the master clock, the internal filter of the ADC(s) is reset at a time synchronous to the restarting of the master clock such that the sampling of the ADC(s) is restarted in response to the resetting of the internal filter. The sampling of the one or more ADCs may be synchronized in relation to a time reference.

In a first aspect, there is provided a method for synchronizing an analog-to-digital converter, ADC, the method comprising: stopping, by a processor, a master clock signal to the ADC to pause sampling of the ADC, the master clock being supplied by an external master clock to the ADC; detecting, by the ADC, that a synchronization event has occurred whilst the master clock is stopped; restarting, by the processor, the master clock signal to the ADC; resetting, by the ADC, an internal filter at a time that is synchronous with the master clock; and resuming, by the ADC, sampling in response to resetting the internal filter of the ADC.

The method for synchronizing the ADC provides the advantage of enabling the ADC to be used in a robust and reliable manner, as the ADC can be used in conjunction with other ADCs without phase error between the output of the ADCs e.g., the ADC is time reference synchronized. This is achieved as it can enable the synchronization of multiple ADCs without the need for separate synchronization signals and without the need for isolation components. This allows the system complexity to be reduced, reduces the hardware costs and limits the possible points of failure etc.

In a second aspect, there is provided a method for synchronizing two or more analog-to-digital converters, ADCs, the method comprising: stopping, by a processor, a shared master clock signal to two or more ADCs to pause sampling of the two or more ADCs, the shared master clock being supplied by an external master clock to the two or more ADCs; detecting, by each of the two or more ADCs, that a synchronization event has occurred whilst the shared master clock is stopped; restarting, by the processor, the shared master clock signal to each of the two or more ADCs; resetting, by each of the two or more ADCs, an internal filter at a time that is synchronous with the master clock; and resuming, by the two or more ADC, sampling in response to resetting their respective internal filters.

The method for synchronizing the two or more ADCs provides the advantage of enabling the ADCs to be used with no phase error between the outputs. In some examples, the two or more ADCs may be oversampling ADCs and as such the method ensures that the two or more ADCs sample the input signal synchronously in relation to a time reference. Removing the phase errors improves the system performance by ensuring that all ADCs within the system are utilized in a robust and reliable manner.

In a third aspect, there is provided an analog-to-digital converter, ADC, system, the system comprising: an ADC comprising an internal filter; a master clock, the master clock being external to and coupled with the ADC and a processor, the processor being external to and coupled with the ADC and the master clock; and a memory and a computer program code stored thereon, wherein the computer program code that, when executed by the processor, causes: stopping, by a processor, a master clock signal to the ADC to pause sampling of the ADC, the master clock being an supplied by external master clock to the ADC; detecting, by the ADC, that a synchronization event has occurred whilst the master clock is stopped; restarting, by the processor, the master clock signal to the ADC; resetting, by the ADC, an internal filter at a time that is synchronous with the master clock; and resuming, by the ADC, sampling in response to resetting the internal filter of the ADC.

The method for synchronizing the ADC provides the advantage of enabling the ADC to be used in a robust and reliable manner, as the ADC can be used in conjunction with other ADCs without phase error between the output of the ADCs e.g., the ADC is time reference synchronized. This is achieved as it can enable the synchronization of multiple ADCs without the need for separate synchronization signals and without the need for isolation components. This allows the system complexity to be reduced, reduces the hardware costs and limits the possible points of failure etc.

Further features and advantages will be apparent from the appended claims.

Definitions

'Synchronizing' in this context involves ensuring that the sampling of each ADC is started at a specific, known time. Therefore, it can be said that synchronization relates to time referenced synchronization wherein multiple ADCs do not necessarily need to be sampling at the same speed as long as the multiple ADCs can all be started at the required specific time.

'Master clock' relates to a clock signal that is supplied to an ADC from an external clock device or source. The master clock differs to the internal clock of the ADC. In systems where multiple ADCs are present the master clock is a shared master clock, as the same external clock device or source is coupled to all of the multiple ADCs within the system.

'Internal clock' relates to the clock signal that is present within any ADC. This clock signal is the clock signal that is used to execute the commands required for general operation of the ADC.

'Synchronization event' relates to some stimulus received at the ADC or detected by the ADC that would indicate that the ADC needs to, or is being instructed to, attempt to synchronize the sampling of the ADC relative to a time reference. This stimulus may be in the form of receiving a command from a processor, or detecting any environment change within the ADC such as the master clock stopping etc.

'Internal filter' relates to a component of the inner circuitry of the ADC. The internal filter is the device within the ADC that is triggered to reset upon detection or indication of a synchronization event. The indication of the synchronization event occurring and the subsequent resetting of the internal filter is what allows the ADC to restart continuous sampling. The internal filter (or internal digital filter), during normal operation in an ADC or oversampling ADC, is used to process samples of the ADC and average said samples to digitally filter the samples. In oversampling ADCs, this process reduces the sample rate.

FIGURES

Further features and advantages of the present disclosure will become apparent from the following description, presented by way of example only, and with reference to the accompanying drawings, wherein like reference numerals refer to like parts, and wherein:

FIG. 11 shows an example flow diagram of the method of operating an ADC system such as ADC system 4a, in accordance with the present disclosure;

FIG. 13 shows an example flow diagram of the method of operating an ADC system such as ADC system 4a, in accordance with the present disclosure; and FIG. 14 shows an example flow diagram of the method of operating an ADC system such as ADC system 4b, in accordance with the present disclosure.

DETAILED DESCRIPTION

Figure 1:
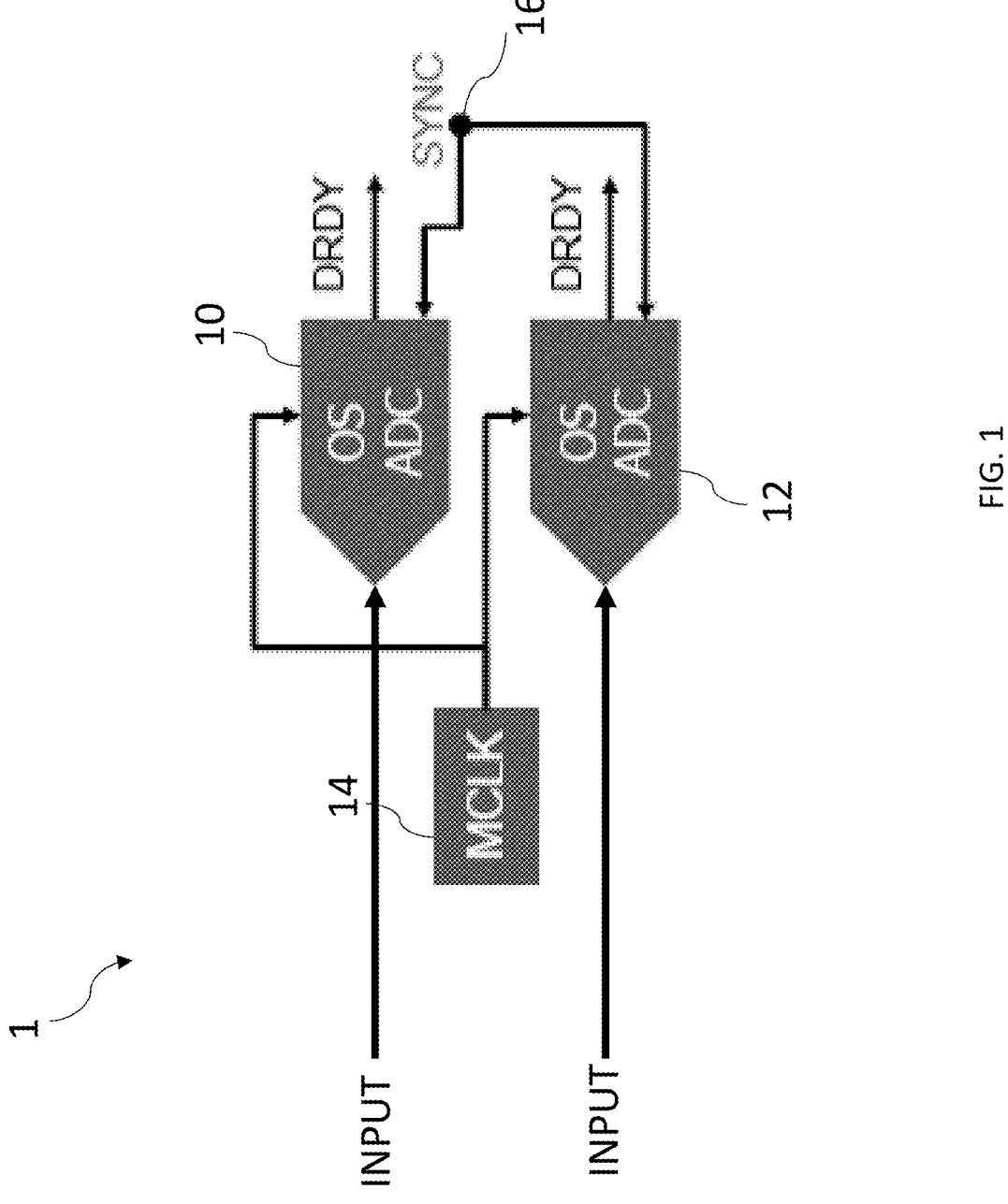
FIG. 1 shows an example schematic diagram of a multiple synchronized ADC system, in accordance with an approach.

The present disclosure provides methods and systems for synchronizing an ADC, or two or more ADCs, such that the ADC(s) are time reference synchronized in a manner that is robust, reliable and efficient. Further, the methods and systems seek to provide ADC time reference synchronization without phase error in the output, minimal hardware and software complexity, minimal hardware footprint, high predictability of synchronization, low cost etc.

More specifically, the present disclosure utilizes an ADC system, having one or more ADCs and a method of operating said system in order to provide time reference synchronization of the sampling of the one or more ADCs in a simple, but robust and reliable manner. The ADC(s) in the system uses a master clock, which may be called a shared master clock. In some examples, the ADC system comprises two or more ADCs and all the ADCs within the system utilize the same physical master clock. In further examples, the ADC system may comprise two or more ADCs that are geographically separated in terms of location. In this example, the two or more ADCs do not physically share a master clock, but share a synchronized version of the master clock. In both the above examples, whether the master clock is physically the same master clock or the synchronized version of the master clock, said master clock is shared between each ADC of the ADC system.

The present inventors have recognized that by stopping and starting the master clock, pausing sampling of the one or more ADCs therebetween, that resuming sampling of the one or more ADCs can be synchronized in relation to a time reference. The one or more ADCs are synchronized to a time reference since the ADC internal filter reset is synchronized with the restarted master clock. Thus, resuming sampling of the one or more ADCs is time reference synchronized. Notably, when sampling of the one or more ADCs is resumed in response to the resetting of the internal filters of each of the one or more ADCs, not only is each ADC synchronous with the master clock but also with one another.

In some instances, the ADC uses a synchronization output signal and a synchronization input signal. The synchronization output signal may be synchronous to the shared master clock. The system is then operated by stopping the master clock. With the master clock stopped, the ADC detects a synchronization event. The detection of the synchronization event may be through receiving a command from the processor indicating that synchronization is requested or through detecting by an internal clock of the ADC, that the master clock has stopped. This does not result in a response from the ADC as the master clock is stopped. The master clock is then restarted following the detection of the synchronization event. This causes an internal filter (internal to the ADC) to reset. The internal filter may be reset, by the ADC, following the detection, by the ADC, that the synchronization event has occurred. It is worth noting that, the internal filter of the ADC may refer to an internal digital filter of the ADC. Thus, the internal filter or the internal digital filter may process the samples or outputs of the ADC. It can also be said that the state of the internal filter may be reset e.g. the current count of the internal filter is reset. In response to the resetting of the filter, the sampling of the ADC restarts. This enables the time referenced synchronization of the ADC using only a single master clock signal, no isolation components and reduced additional signal connections. This means the system of the present disclosure has reduced hardware requirements, a reduced footprint, reduced components and construction costs etc. The system of the present disclosure also has improved reliability of ADC sampling by providing capability for time referenced synchronization by being robust to sampling/edge timing ambiguity, therefore reducing the risk of phase error on the outputs of the ADC.

Further, it may be said that the resetting of the internal filter comprises a first change of state of the internal filter at a time that is synchronous with the master clock and a second change of state of the internal filter at a time that is synchronous with the master clock, wherein the first change of state may be opposite to the second change of state and wherein the second change of state may occurs after a fixed number of master clock cycles following the first change of state. In this scenario, the resuming of the sampling of the ADC may comprise resuming sampling in response to the second change of state of the internal filter of the ADC.

In other instances, the present disclosure provides a multiple ADC system, the multiple ADC system being arranged such that all ADCs of the system share a master clock. Again, time referenced synchronization of the ADCs is achieved using only a single master clock signal by restarting sampling of the ADCs in response to the resetting of the internal filters of each of the ADCs.

The ADC internal filter may be a digital filter integrated on the ADCs. The ADC internal filter is used to remove/reject unwanted signals from certain frequency spectrum. The decimation process, similar to averaging multiple input samples to produce one output data, is also achieved by the internal filter. The internal filter is an inherent part of the ADC, which may be an oversampling ADC. For example, an ADC with an internal filter for executing decimation of 8 takes every 8 input samples, average them, and produce a single output. If the ADC system comprises two ADCs to monitor the same input signal, without synchronization, the first ADC may average samples 1,2,3,4,5,6,7,8 and produce one sample, and the other ADC may average samples 5,6,7,8,9,10,11,12 and produce one sample. Both ADCs produce the output at the same rate, but the output is different due to the mismatch of the input signal phase. The synchronization process of the present disclosure essentially resets the ADC internal filters of the two ADCs. Thus, the ADC internal filters on both ADCs will cause resuming of sampling of each ADC to be synchronized.

In conjunction with the ADC system and the multiple ADC system, the present disclosure provides a method of operating the ADC systems. The method includes stopping the master clock (MCLK), by a processor, to the ADC to stop the sampling of the ADCs, then detecting a synchronization event. Next, the method restarted the master clock of the ADC. Upon restart of the master clock, the ADC(s) responds to the synchronization event by resetting an internal filter of the ADC and in response restart the sampling of the ADC. Therefore, the sampling of the ADC or multiple ADCs is synchronized according to a time reference.

In some examples, the ADC system is connected to, and controlled by, a Field Programmable Gate Array (FPGA) device. In the present disclosure, the method of operating the ADC system may use the FPGA to issue an instruction to stop the master clock. The FPGA then initiates synchronization of the ADC(s) by providing a stimulus to the ADC(s), that the ADC(s) would detect as a synchronization event. The FPGA then issues a command to restart the master clock. In some scenarios, the FPGA may monitor the output of the ADC(s) to determine whether new output data is ready and therefore, whether sampling of the ADC(s) are synchronous in respect of a time reference.

In other examples, the ADC system is connected to, and controlled by, a Microcontroller Unit (MCU) device. In the present disclosure, the method of operating the ADC system may use the MCU to issue an instruction to stop the master clock. The MCU then initiates synchronization of the ADC(s) by providing a stimulus to the ADC(s), that the ADC(s) would detect as a synchronization event. The MCU then issues a command to restart the master clock. In some scenarios, the MCU may then monitor the output of the synchronized ADCs to determine whether new output data is ready and therefore, whether sampling of the ADC(s) are synchronous in respect of a time reference.

The present disclosure will now be discussed in more detail in relation to the associated Figures.

FIG. 1 shows an example schematic diagram of a multiple ADC system 1. This system provides an example of a system for synchronizing multiple ADCs. The multiple ADC system 1 comprises a first ADC 10, a second ADC 12, a master clock (MCLK) 14. The synchronization input signals of the first ADC 10 and the second ADC 12 are coupled together to ensure the first ADC 10 and the second ADC 12 have a shared synchronization signal (SYNC) 16. It can also be seen from FIG. 1 that the multiple ADC system 1 further comprises that each ADC comprises an input pin and a data ready output (DRDY).

In more detail, it can be seen that the master clock 14 is coupled to an input of both the first ADC 10 and the second ADC 12. Thus, it is apparent that the first ADC 10 and the second ADC 12 share a common master clock 14 signal. Moreover, as discussed above, the first ADC 10 and the second ADC 12 have their synchronization input signals coupled together such that they also share a common SYNC 16.

In this example, the first ADC 10 and the second ADC 12 sample the input pin multiple times to produce one data output at the DRDY output. In this example, the first ADC 10 and the second ADC 12 samples their corresponding input pins simultaneously due to the shared master clock 14, however, they may not produce the output of the DRDY output at the same time. Thus, this can create a synchronization issue with the two ADCs and leads to phase error in the measurement.

Figure 2:
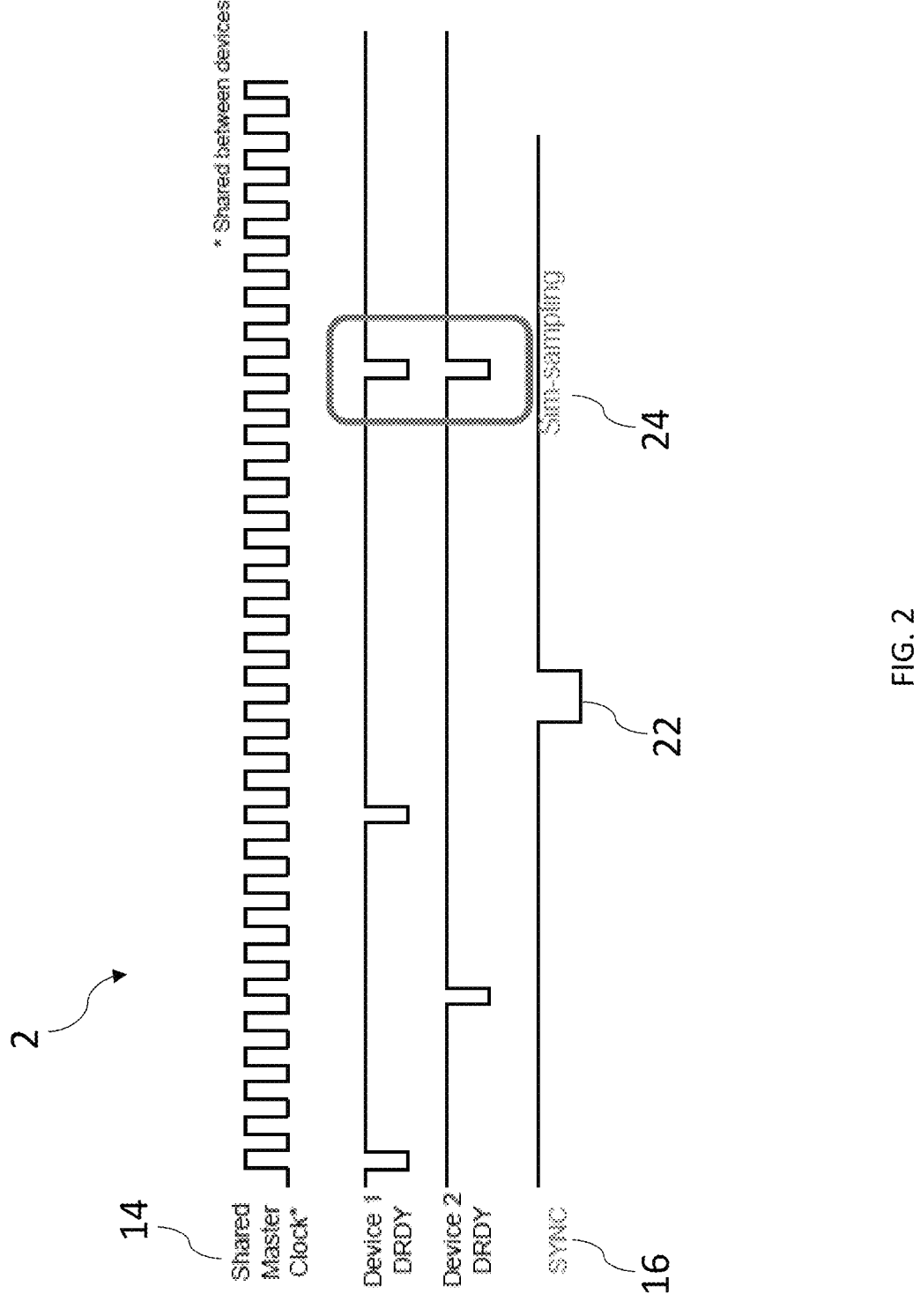
FIG. 2 shows an example timing diagram for the multiple synchronized ADC system of FIG. 1, in accordance with an approach.

This can be described in more detail in relation to the associated example timing diagram 2 of FIG. 2.

In FIG. 2, the shared master clock 14 (as seen in FIG. 1) is shown running at a constant frequency. The figure further shows the DRDY output over time of device 1 and device 2 i.e. the DRDY output of the first ADC 10 and the second ADC 12. Finally, the figure shows the shared SYNC 16 (as seen in FIG. 1) over time. It can be seen that the SYNC 16 can be used to synchronize the sampling between multiple ADCs. This is shown by the SYNC 16 initiating at the initiation point 22, which in turn causes a synchronized DRDY output 24 on both the first ADC 10 and the second ADC 12 (in other words Device 1 and Device 2).

For this to occur, the SYNC 16 needs to be synchronous to the master clock 14 i.e. the falling edge of the SYNC 16 may align with a falling edge of the master clock 14. In this regard, the master clock 14 drives on the falling edge and sample on the rising edge. Since the first ADC 10 and the second ADC 12 use the master clock 14 to sample the SYNC 16 signal, when the SYNC 16 is synchronized to the master clock 14 signal, sampling of the SYNC 16 will always yield the same result from a timing point of view.

However, this system for synchronization encounters a problem when the SYNC 16 falls out of synchronization with the master clock 14 i.e. when the SYNC 16 is asynchronous to the master clock 14. The edge timing of the SYNC 16 can be ambiguous. This occurs as the SYNC 16 cannot instantly transition from high to low instantaneously. Therefore, this creates an instance wherein there is ambiguity between the SYNC 16 and the sample timing of the master clock 14 signal. As such, it can occur that one ADC detects the SYNC 16 but another ADC does not detect the SYNC 16. As a result, the ADC that detected the SYNC 16 would output on the DRDY output before the other ADC that did not detect the SYNC 16. It would be expected that there would be a one master clock 14 period phase offset between the ADCs. This can also be considered a phase error.

In other words, when the SYNC 16 is asynchronous to master clock 14, sampling of the SYNC 16 can result in timing ambiguity between two ADCs. This occurs when the SYNC pulse edge lands near the master clock sampling edge e.g. one ADC registers the SYNC 16 where the other does not. This can create a phase offset of one master clock 14 period between the two ADCs.

Therefore, there is a need to provide a system and method of synchronising an ADC, or multiple ADCs, to a time reference in order to develop an ADC system that is more robust and reliable. More specifically, there is a need to provide a system and method of synchronising an ADC, or multiple ADCs, to a time reference point such that it is more robust and reliable at providing synchronised outputs following ADC sampling, by reducing or preventing phase error on the outputs of the ADCs.

Figure 3:
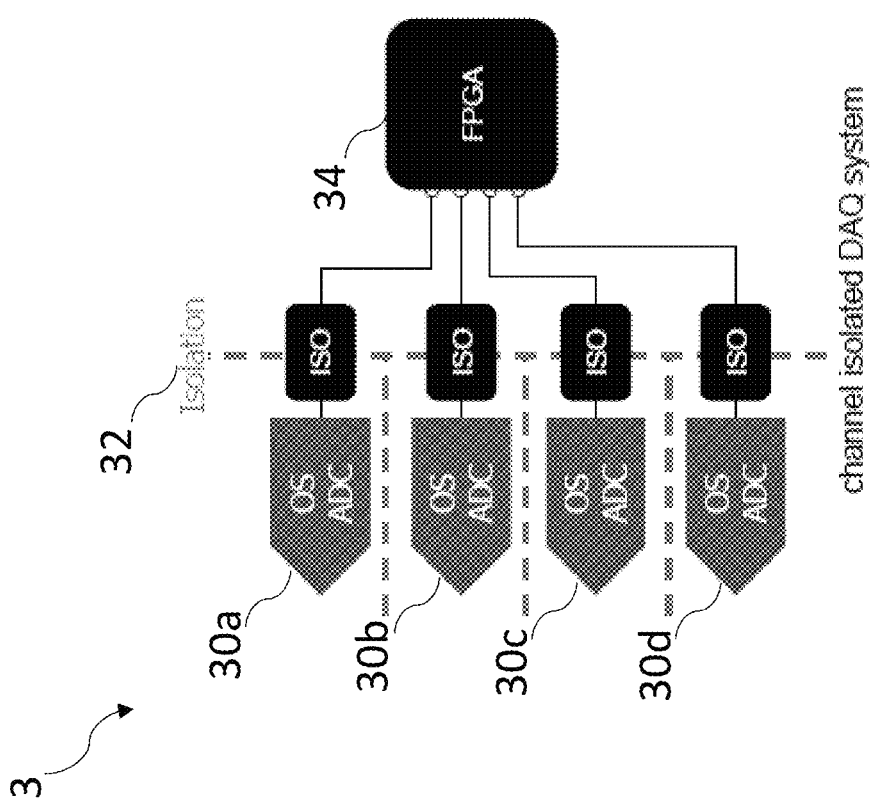
FIG. 3 shows an example schematic diagram of a channel isolated DAQ system, in accordance with an approach.

FIG. 3 shows an example schematic diagram of a channel isolated DAQ system 3, in accordance with an approach. The channel isolated DAQ system 3 comprises a plurality of ADCs 30a-30d, each of the ADCs 30a-30d having a corresponding isolator (ISO) 32 and a FPGA 34. The channel isolated DAQ system 3 being arranged such that the ADCS 30a-30d are isolated from the FPGA 34 by their associated isolator 32.

In channel isolated DAQ systems, like that of FIG. 3, the synchronizing of the ADC on each channel requires bringing both the master clock and the SYNC across the isolation on high-speed isolation channels for each ADC channel. This adds a large amount of power consumption, system complexity, increases the chances of failure points within the system and increases the cost required for synchronisation.

In a similar example, network distributed DAQ systems are also used. In network distributed DAQ systems, synchronizing ADCs requires the system to generate both master clock and SYNC with precise timing (this can be achieved with precision timing protocols such as IEC 1588). However, this increases the resource requirement on the network controller as not all network controllers have two timers e.g. ADIN1110 MACPHY for 10baseT1L only has 1 TS_TIMER.

Therefore, there is a further need for a system and method for time referenced synchronization of an ADC, or multiple ADCs, that has a low system complexity, low system cost, low power consumption etc. while ensuring robust and reliable synchronisation of ADC outputs.

The present disclosure seeks to provide solutions to the aforementioned problem. The solutions, in accordance with the present disclosure, will now be discussed in relation to FIGS. 4-14.

Figure 4A:
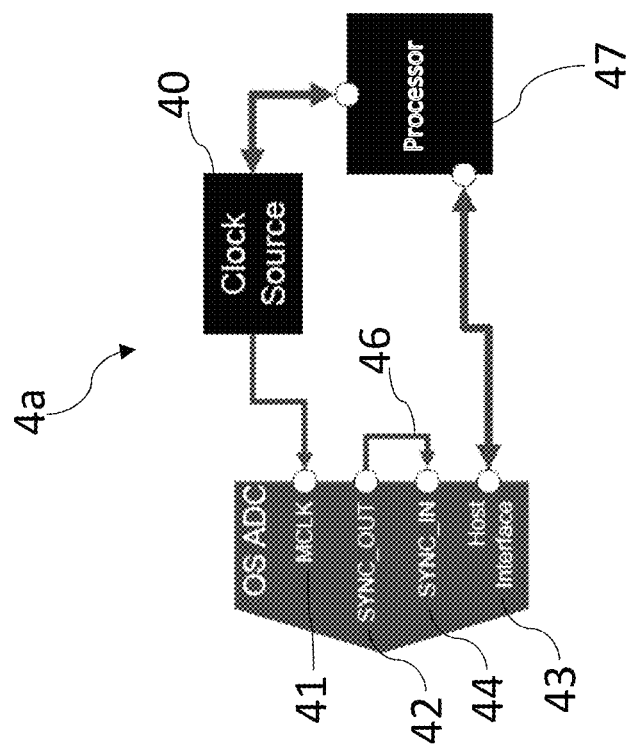
FIG. 4a shows an example schematic diagram of an ADC, in accordance with the present disclosure.

FIG. 4a shows an example schematic diagram of an ADC system 4a. The ADC system 4a comprises an ADC, a clock source 40 and a processor 47. The processor 47 is communicatively coupled to the clock source 40. The clock source 40 is coupled to the master clock (MCLK) 41 of the ADC. The processor 47 is coupled to the host interface 43 of the ADC. The ADC also comprises a synchronisation output signal (SYNC_OUT) 42 and a synchronisation input signal (SYNC_IN) 44, which in this non-limiting example are coupled together, such that the synchronisation output signal provides the signal to the synchronisation input signal 44. However, in other examples, the synchronisation output signal 42 may be coupled to the synchronisation input signal 44 within the ADC circuitry, as will be discussed in relation to FIG. 4b.

In this example, the synchronization output signal 42 is a mechanism, or pin, that exists in many ADC systems 4a. In this regard, the ADC system 4a can generate a signal from the synchronization output signal 42 that is synchronous to the master clock 40. Due to the internal arrangement of the ADC 4a, the synchronization output signal 42 can be triggered in many ways, for example, by an asynchronous digital input or by a SPI command etc. Therefore, the synchronization output signal 42 can be coupled to the synchronization input signal 44 via the coupling 46, in order to synchronize the ADC 4a. This feature is typically used to synchronize multiple ADCs i.e. the plurality of ADCs would have a shared master clock and one ADC would generate the synchronization output signal couples to the synchronization input signal of all other ADCs. This system ensures that the synchronization input signal and the master clock are synchronous, but it cannot typically achieve precision timing synchronous to the lack of timing control of the triggering signal/command, especially if it is controlled by a MCU based host device or the like.

Therefore, the present disclosure provides a method of operating an ADC system, which may comprise a single ADC or multiple ADCs, to achieve precision time synchronization. This method of operating will be discussed in more detail below.

Figure 4B:
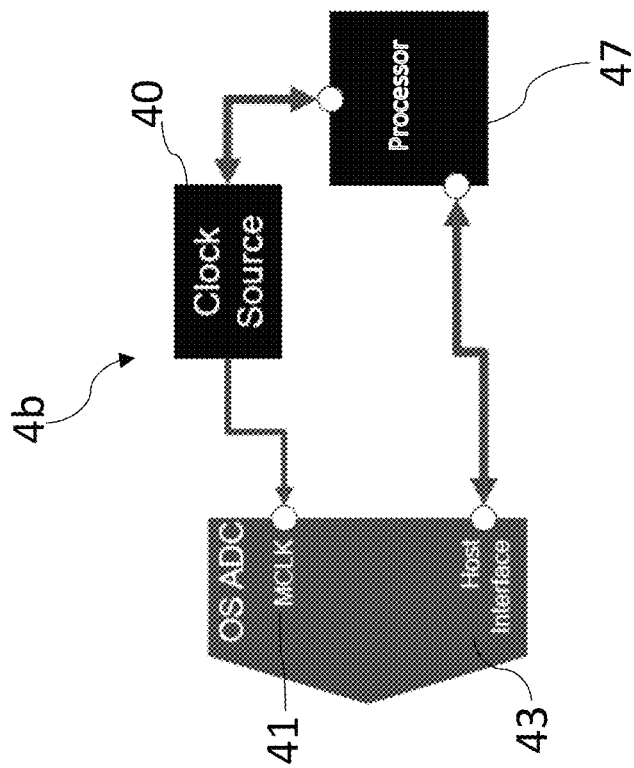
FIG. 4b shows an example schematic diagram of an ADC, in accordance with the present disclosure.

FIG. 4b shows a further example schematic diagram of an ADC system 4b. The ADC system 4b comprises an ADC, a clock source 40 and a processor 47. The processor 47 is communicatively coupled to the clock source 40. The clock source 40 is coupled to the master clock (MCLK) 41 of the ADC. The processor 47 is coupled to the host interface 43 of the ADC. The main difference between the ADC system 4b in FIG. 4b and the ADC system 4a in FIG. 4a, is the lack of synchronisation output signal pin 42 and synchronisation input signal pin 43. This is the case, as discussed above, because the ADC system 4b in FIG. 4b has the corresponding synchronisation output signal coupled to the synchronisation input signal internally within the ADC circuitry. Therefore, despite the lack of external synchronisation input/output signal pins, the ADC system 4b has the same functionality in respect of the synchronisation signals as in ADC system 4a.

Figure 5:
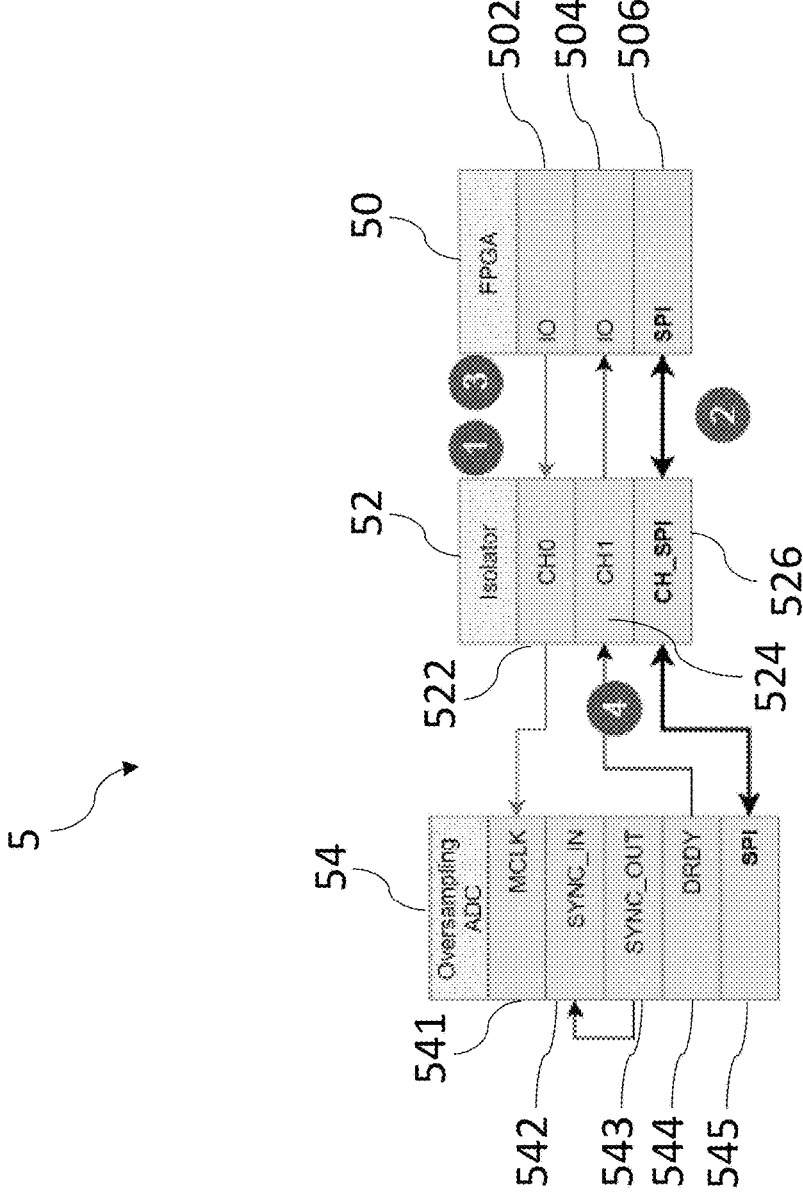
FIG. 5 shows an example schematic diagram of an FPGA system, in accordance with present disclosure.

FIG. 5 presents a further example schematic diagram of an ADC system 5 for synchronizing an ADC or multiple ADCs using an FPGA 50. It can be seen that the system 5 comprises an FPGA 50, an isolator 52 and an ADC 54. The ADC 54 may be an oversampling (OS) ADC. The FPGA 50 comprises a first IO pin 502, a second IO pin 504 and an SPI pin 506. The isolator 52 comprises a first channel (CH0) 522, a second channel (CH1) 524 and third channel (CH_SPI) 526. The ADC 54 comprises a master clock 541, a synchronization input signal (SYNC_IN) 542, a synchronization output signal (SYNC_OUT) 543, a DRDY pin 544 and an SPI pin 545.

The first IO pin 502 of the FPGA 50 is connected to the first channel (CH0) 522 of the isolator 52. The first channel (CH0) 522 of the isolator 52 is in turn connected to the master clock 541 of the ADC 54. Therefore, the first IO pin 502 of the FPGA 50 can send an instruction via the first channel (CH0) 522 of the isolator 52 to the master clock 541 of the ADC 54. The instruction from the FPGA 50 can be to stop or re-start the master clock 541 of the ADC 54. The FPGA 50 re-starts the master clock 541 with precisely controlled timing.

The second IO pin 504 of the FPGA 50 is connected to the second channel (CH1) 524 of the isolator 52. The second channel (CH1) 524 of the isolator 52 is in turn connected to the DRDY pin 544 of the ADC 54. In this regard, an output signal from the DRDY pin 544 of the ADC 54 is fed into the second channel (CH1) 524 of the isolator 52 and then on to the second IO 504 of the FPGA 50. The FPGA 50 uses the connection with the DRDY pin 544 of the ADC 54 to monitor the DRDY signal from the ADC 54 to determine when new output data is ready.

The SPI pin 506 of the FPGA 50 is connected to the third channel (CH_SPI) 526 of the isolator 52. The third channel (CH_SPI) 526 of the isolator 52 is connected to the SPI pin 545 of the ADC 54. The SPI pin 506 of the FPGA 50, the third channel (CH_SPI) 526 of the isolator 52 and the SPI pin 545 of the ADC all have bidirectional communication. Therefore, the FPGA 50 can send SPI instructions or commands to the ADC 54. This allows the FPGA 50 to control the initiation of the ADC 54 synchronization process. Likewise the ADC 54 can send SPI data in return to the FPGA 50.

Therefore, one or more of the following steps (the numbered steps 1-4 relate to the points 1-4 of FIG. 5) are used to synchronize two or more ADCs 54 using the FPGA 50:

1. the first IO pin 502 of the FPGA 50 will be used to send a signal to the master clock pin 541 of the ADC 54 (via the first channel (CHO) 522 of the isolator 52) to stop the master clock 541 output;
2. the SPI pin 506 of the FPGA 50 will be used to send an SPI instruction to the SPI pin 545 of the ADC 54 (via the third channel (CH_SPI) 526 of the isolator 52) to trigger synchronization of the ADC 54;
3. the first IO pin 502 of the FPGA 50 will be used to send a signal to the master clock pin 541 of the ADC 54 (via the first channel (CHO) 522 of the isolator 52) to restart the master clock 541 output;
4. the second IO pin 504 of the FPGA 50 will be used to monitor the DRDY 544 signal from the ADC 54 (via the second channel (CH1) 524 of the isolator 52) to determine when new output data is ready and that the ADCs are sampling synchronously.

Figure 6:
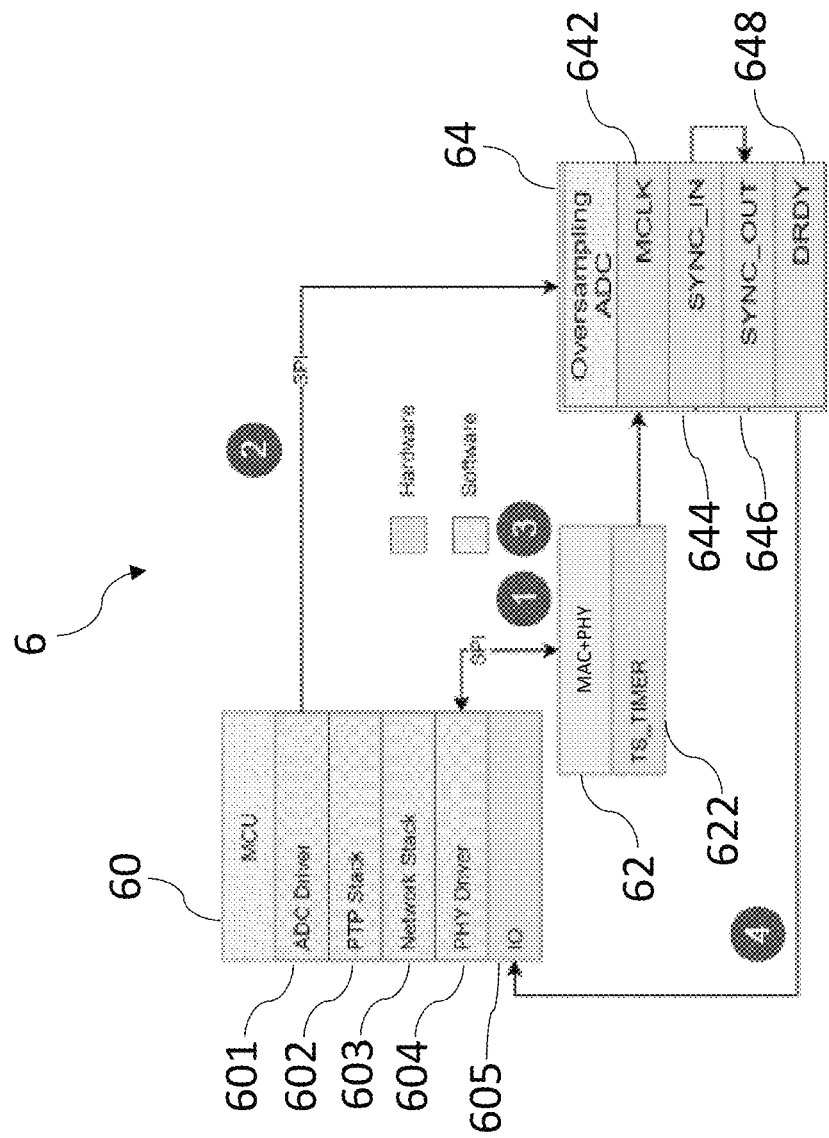
FIG. 6 shows an example schematic diagram of an MCU system, in accordance with the present disclosure.

FIG. 6 presents an example schematic diagram of a system 6 for synchronizing multiple ADCs using an MCU 60. It can be seen that the system 6 comprises an MCU 60, a MAC+PHY device 62 and an ADC 64. The ADC 64 may be an oversampling (OS) ADC. The MCU 60 comprises elements of software and hardware. The software elements include an ADC driver 601, a PTP stack 602, a network stack 603 and PHY driver 604. The hardware elements include an IO pin 605. The MAC+PHY device 62 contains hardware elements such as a timer (TS_TIMER) 622. The ADC 62 comprises hardware elements such as a master clock 642, a synchronization input signal (SYNC_IN) 644, a synchronization output signal (SYNC_OUT) 646 and a DRDY pin 648.

In the example of FIG. 6, the PHY Driver 604 of the MCU 60 is connected to the MAC+PHY device 62 such that SPI instructions (or the like) can be communicated. The timer (TS_TIMER) 622 of the MAC+PHY device 62 is connected to the master clock 642 of the ADC 64. The synchronization input signal 644 of the ADC 64 is coupled to the synchronization output signal 646 of the ADC 64, as mentioned previously. The DRDY pin 648 of the ADC 64 is connected to the IO pin 605 of the MCU 60. The ADC Driver 601 of the MCU 60 is also connected to the ADC 64 such that SPI instructions (or the like) can be communicated.

Therefore, one or more of the following steps (the numbered steps 1-4 relate to the points 1-4 of FIG. 6) are used to synchronize two or more ADCs 64 using the MCU 60:

1. the PHY Driver 604 of the MCU 60 is used to instruct (via an SPI instruction or the like) the MAC+PHY device 62 to use the timer 622 to stop the master clock 642 of the ADC 64;
2. the ADC Driver 601 of the MCU 60 is used to send a SPI instruction (or the like) to the ADC 64 to initiate synchronization of the ADCs 64;
3. the PHY Driver 604 of the MCU 60 is used to instruct (via an SPI instruction or the like) the MAC+PHY device 62 to use the timer 622 to restart the master clock 642 of the ADC 64 with precisely controlled timing. The precisely controlled timing may be achieved by using a standard or protocol, for example, IEEE 1588 Precision Time Protocol;
4. the IO pin 605 of the MCU 60 is used to monitor a change in the DRDY pin 648 of the ADC 64 to determine when new output data is ready and that the ADCs are sampling synchronously.

Whilst FIG. 6 is described in relation to a MAC+PHY device 62, it is worth noting that the same operation could be achieved with alternative device arrangements. By way of a further example, the operation may be achieved by having the MAC incorporated within the MCU with appropriate timestamping and clock synchronization support. In a further example, the operation may be achieved by having a multiport Ethernet switch (in place of the MAC+PHY device 62), the multiport Ethernet switch comprising the same timestamping and clock synchronization support. In either example, the PHY(s) may be incorporated into the MCU+ MAC arrangement or incorporated into the multiport Ethernet switch.

Figure 7:
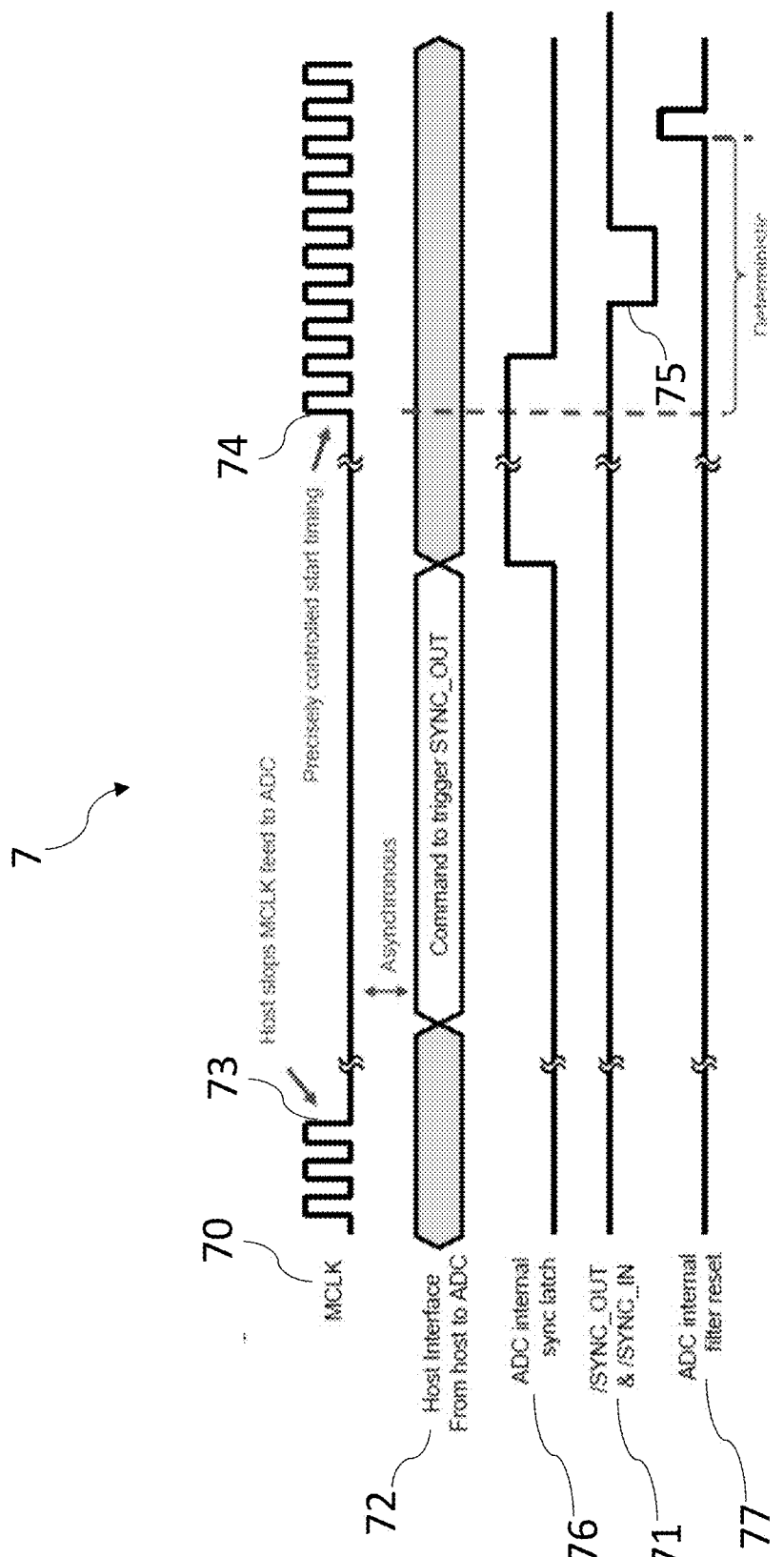
FIG. 7 shows an example timing diagram for use with the ADC system of FIG. 4a, in accordance with the present disclosure.

The timing diagram 7 of FIG. 7, corresponds to the ADC system 4a of FIG. 4a. The timing diagram 7 incorporates a master clock 70 signal, a synchronization output signal & synchronization input signal 71 (this corresponds to the synchronization output signal 42 and synchronization input signal 44 of FIG. 4a) signal, an interface between the processor and the ADC 72 (corresponding to the host interface 43 in FIG. 4a/4b), an ADC internal syn latch or ADC internal latch 76 and an ADC internal filter reset 77.

The timing diagram 7 shows the master clock 70 is switched off at point 73. Thus, the master clock 70 for the ADC, or all associated ADCs, is turned off. Turning off the master clock 70 does not cause any issues for the standard ADC operation. During the time in which the master clock 70 is turned off, a synchronization event, in this example a trigger command is received at the interface 72 (e.g. an SPI instruction command) is received to trigger the synchronization output signal 71 (and the synchronization input signal, since the synchronization output signal and the synchronization input signal are coupled together). The signal at the interface 72 to trigger the synchronization output signal 71 can be asynchronous to the master clock 70 and can be registered by the ADC without the master clock 70 running. On the ADC(s), the synchronization output signal and the synchronization input signal 71 are all controlled by the internal logic of the ADC which is in turn controlled by the master clock 70. Therefore, the synchronization output signal 71 does not trigger when the synchronization event is received at the interface 72 as the master clock 70 is switched off. Thus, at point 74 the master clock 70 is turned back on.

During the master clock 70 off period, the ADC internal latch 76 switches in response to the received synchronization event. Upon resumption of the master clock 70, the ADC internal latch 76 switches back, the synchronization output signal 710 then triggers. The triggering of the synchronization output signal 71 occurs at point 75. Since the ADC(s) within the system utilize the master clock 70 signal, the ADC internal filter reset triggers at time synchronous with the master clock 70, after the master clock has restarted 74 and after the synchronization output signal has triggered 75. In response to the resetting of the ADC internal filter 77, the time synchronized restart of the ADC(s) occurs at a deterministic time after the restart of the master clock 70 and reset of the ADC internal filter 77. If the master clock 70 is stopped and restarted with precise start timing in combination with the synchronization output signal/synchronization input signal mechanism, then precision sample synchronization is achieved relative to a reference time with only one master clock 70 signal.

In this example, the accuracy of synchronizing the one or more ADCs depends on restarting the master clock at a precisely controlled time.

To ensure the master clock 70 is restarted with precision start timing, a Precision Time Protocol (PTP) may be used. A PTP can be used to synchronize clocks throughout an electronics system, computer network or the like; in particular in networks and systems PTP can be used to achieve very reliable clock accuracy. This clock accuracy in many cases can be in the range of less than microseconds, which makes it suitable for a plethora of applications. Many PTP standards have been published and continue to be developed. Further, there are many methods for achieving precise controlled start timing of a master clock e.g. IEEE1588 can be used.

In other words, an approach to precision timing may be for synchronous network systems to agree to align on a repeating boundary. For example, ADC samples may be started on a second boundary, or some multiple of 32 microsecond periods since midnight Dec. 31, 1970, etc. In this way, the ADCs all operate in a period less than described (32 microseconds, or as the case may be), they are effectively synchronized. Thus, a device can recover from a fault and then restart synchronous operation without shutting down the entire system.

The synchronization output signal and the synchronization input signal may be related to pins of the ADCs or they may relate to synchronization output signal/synchronization input signal from the ADCs. Since, the ADCs may be arranged such that the synchronization output signal is coupled to the synchronization input signal pin, the synchronisation signal output may use generation logic within the ADC such that the shared master clock ensures an output signal is synchronous to the shared master clock, to create synchronous ADCs. The generation logic behavior of the ADC is similar to that of a D-flip flop in the way that the input change is asynchronous to the master clock but the output is synchronous with the master clock. As discussed previously, the synchronization output signal and the synchronization input signal may be coupled together on external pins of the ADC or in the internal circuitry of the ADC.

Whilst the above description discusses the synchronization event likely being an SPI instruction command at the processor/ADC interface 72, other command types can be used. For example, the synchronization event may be a command made to the processor/ADC interface 72 via a pin toggle. In this scenario, the command may be synchronous or asynchronous to the shared master clock and may not be required at a predetermined time.

It is worth noting that the master clock (MCLK) 70 may be restarted at a predetermined time and the predetermined time may correspond to the rising edge.

Further, the method as discussed in relation to FIG. 7, may also require the system to monitor the synchronized restarting of the ADC sampling. This may require monitoring the synchronization output signal 71 or the DRDY pin (as discussed in relation to FIGS. 5-6) to ensure that all ADCs within the system are sampling synchronously in respect of a time reference.

The above-mentioned method for synchronizing an ADC, or multiple ADCs, is performed by a computer implemented system. The system may comprise at least one processor and at least one computer readable storage medium storing computer readable instructions that when executed by the processor cause the processor to perform the methods as discussed in within the examples explained in the present disclosure.

The aforementioned method as discussed in relation to FIG. 7, provides a method for synchronizing an ADC, or multiple ADCs, with only one master clock signal and optionally, only one further processor signal, which may be called a synchronization signal. This differs to existing synchronization systems which often require multiple clock signals and multiple further synchronization signals and components. As such, the systems and methods in the present disclosure provide a system for time references synchronization of ADCs with reduced complexity, reduced hardware components, reduced footprint, reduced hardware costs etc.

Figure 8:
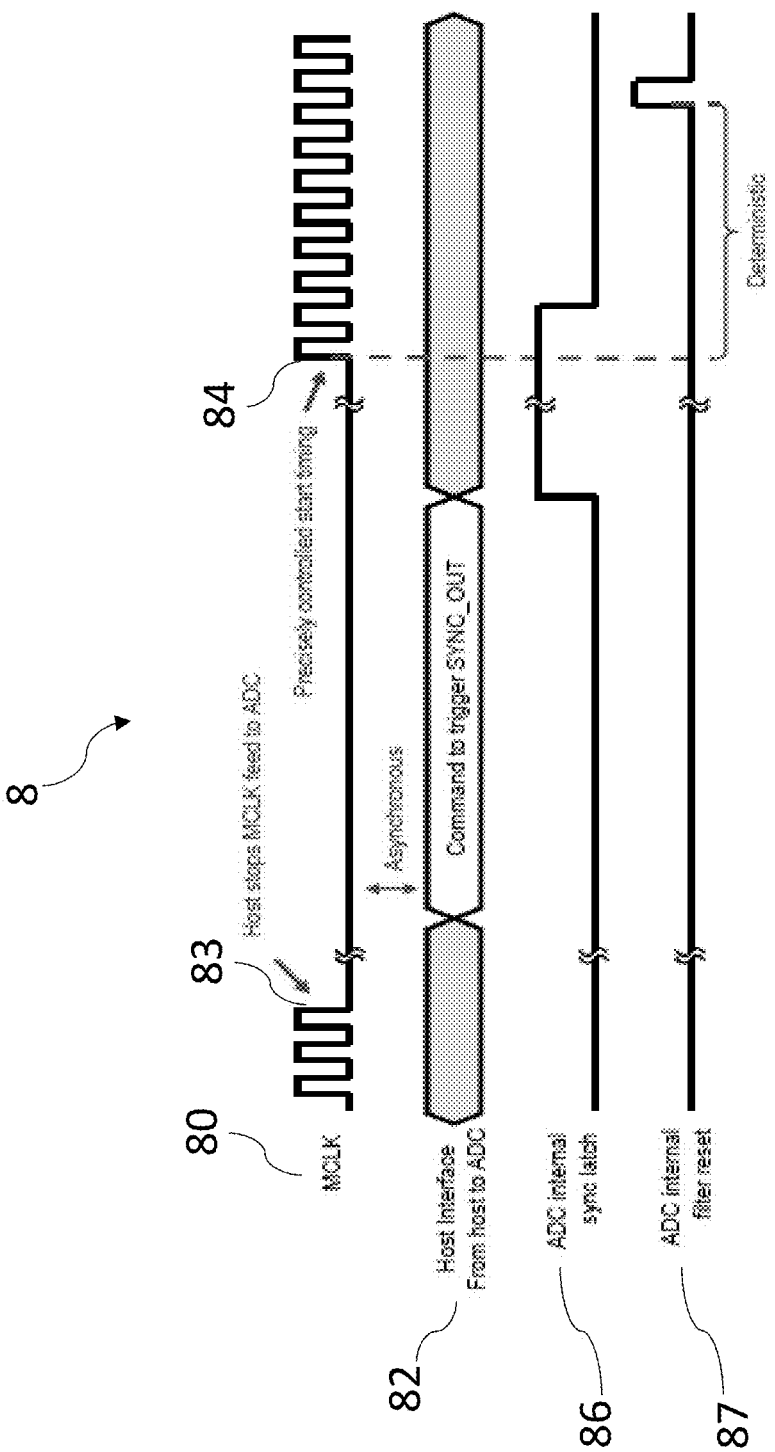
FIG. 8 shows an example timing diagram for use with the ADC system of FIG. 4b, in accordance with the present disclosure.

FIG. 8 relates to a further example timing diagram 8 for operating an ADC system. Example timing diagram 8 relates to the ADC system 4b as shown in FIG. 4b, as the synchronization output/input signals are coupled together in the internal circuitry of the ADC.

The timing diagram 8 incorporates a master clock 80 signal, an interface between the processor and the ADC 82 (corresponding to the host interface 43 in FIG. 4b), an ADC internal syn latch or ADC internal latch 86 and an ADC internal filter reset 87.

The timing diagram 8 shows the master clock 80 is switched off at point 83. Thus, the master clock 80 for the ADC, or all associated ADCs, is turned off. Turning off the master clock 80 does not cause any issues for the standard ADC operation. During the time in which the master clock 80 is turned off, a synchronization event, in this example a trigger command is received at the interface 82 (e.g. an SPI instruction command). In the timing diagram 7, this step triggered the output on the synchronization output signal (coupled to the synchronization input signal), however, in this example the synchronization output/input signals are coupled internally. Nonetheless, given the master clock 80 is turned off, the ADC(s) does not act on the synchronization event e.g. the ADC does not act on the trigger command, except that the ADC internal latch 86 switches. During the master clock 80 off period, the ADC internal latch 86 switches in response to the received synchronization event. Upon resumption of the master clock 80, the ADC internal latch 86 will switch back and the ADC internal filter 87 resets at a deterministic time after the restarting of the master clock. In response to the resetting of the ADC internal filter reset 87, the ADC(s) restarts sampling at a deterministic time after the restart of the master clock 80 and resetting of the ADC internal filter 87. If the master clock 80 is stopped and restarted with precise start timing in combination with the internal synchronization output signal/synchronization input signal mechanism, then precision sample synchronization is achieved relative to a reference time with only one master clock 80 signal.

As previously mentioned, the accuracy of synchronizing the one or more ADCs depends on restarting the master clock at a precisely controlled time. In practice, the MAC+ PHY device (or equivalent) may have an internal frequency and value-adjusted clock that matches the timing of the master clock (IEEE 1588). It then may have logic to generate one or more external signals based on that clock, in this case the master clock that is fed to the ADCs. Then, we may install a 'start time register' wherein the processor installs a value that corresponds to some agreed-upon time in the future. When the synchronized clock in the MAC+ PHY matches that start time register value, it may begin operating the master clock output signal to the ADC. Thus, all the ADCs that are synchronized use the same start time to begin master clock operating, resulting in synchronous ADC output generation.

Figure 9:
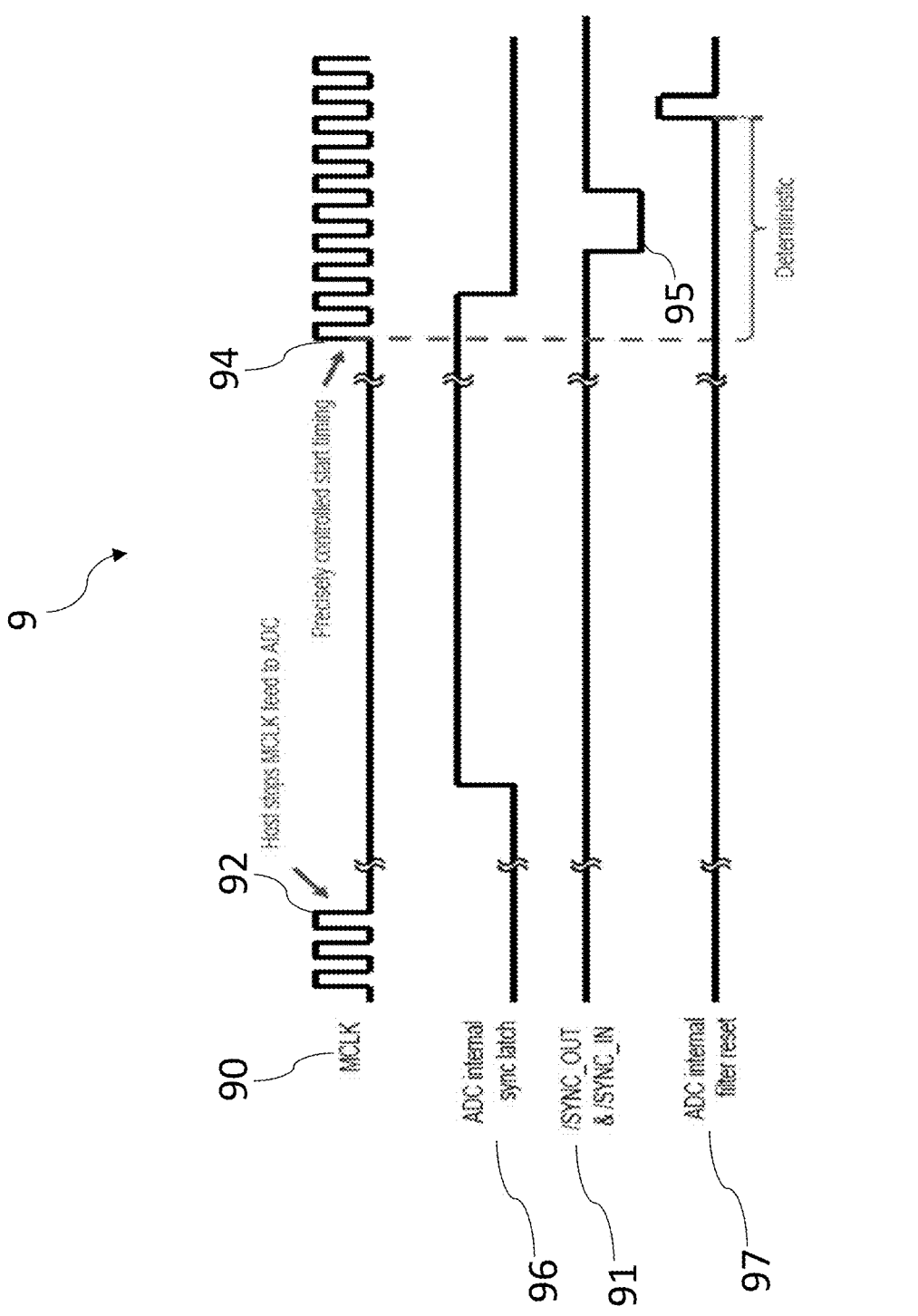
FIG. 9 shows an example timing diagram for use with the ADC system of FIG. 4a, in accordance with the present disclosure.

FIG. 9 relates to a further example timing diagram 9 for operating an ADC system. Example timing diagram 9 relates to the ADC system 4a as shown in FIG. 4a, as the ADC system 4a comprises coupled external synchronization input/output signal pins.

The timing diagram 9 incorporates a master clock 90 signal, a synchronization output signal & synchronization input signal 91 (this corresponds to the synchronization output signal 42 and synchronization input signal 44 of FIG. 4a) signal, an ADC internal syn latch or ADC internal latch 96 and an ADC internal filter reset 97. Therefore, it can be seen that the main difference between example timing diagram 9 and example timing diagrams 7/8 is that there is no presence of the processor/host interface for receiving a synchronization event or command. The ADC and the processor is still be coupled at an ADC interface, however, in this example, that interface is not used for receiving the synchronization event or a command associated with the synchronization event.

Instead, the ADC detects the synchronization event automatically by detecting that the master clock has been stopped. Thus, it can be said, that example as described in relation to FIG. 9, performs auto-synchronization every time the ADC (or multiple ADCs) detects a stoppage in the master clock.

Therefore, in this example, the ADC system 4a operates as follows, in accordance with timing diagram 9.

The timing diagram 9 shows the master clock 90 is switched off at point 93. Thus, the master clock 90 for the ADC, or all associated ADCs, is turned off. Turning off the master clock 90 does not cause any issues for the standard ADC operation. The ADC is continuously checking the operation of the ADC to ensure that the master clock 90 is still operating in connection with the ADC. This may be achieved by polling the master clock pin on the ADC. When the ADC detects that the master clock 90 has stopped e.g. at point 93, then the ADC takes this as being an indication that a synchronization event has occurred. The ADC now triggers the synchronization output signal 91 (and the synchronization input signal, since the synchronization output signal and the synchronization input signal are coupled together).

On the ADC(s), the synchronization output signal and the synchronization input signal 91 are all controlled by the internal logic of the ADC which is in turn controlled by the master clock 90. Therefore, the synchronization output signal 91 does not trigger when the synchronization event is detected (by the master clock 90 being turned off), as the master clock 90 is switched off. During the master clock 90 off period, the ADC internal latch 96 switches in response to the detection of the synchronization event. Thus, at point 94 the master clock 90 is turned back on. Upon resumption of the master clock 90, the ADC internal latch 96 switches back, the synchronization output signal 91 then triggers. The triggering of the synchronization output signal 91 occurs at point 95. Since the ADC(s) within the system utilize the master clock 90 signal, the ADC internal filter 97 resets at a deterministic time after the restart of the master clock 90 and the triggering of the synchronization output signal 95. The synchronized restarting of the ADC(s) sampling occurs at a deterministic time after the restart of the master clock 90, the synchronization output signal 95 and ADC internal filter 97 reset. If the master clock 90 is stopped and restarted with precise start timing in combination with the synchronization output signal/synchronization input signal mechanism, then precision sample synchronization is achieved relative to a reference time with only one master clock 90 signal.

Figure 10:
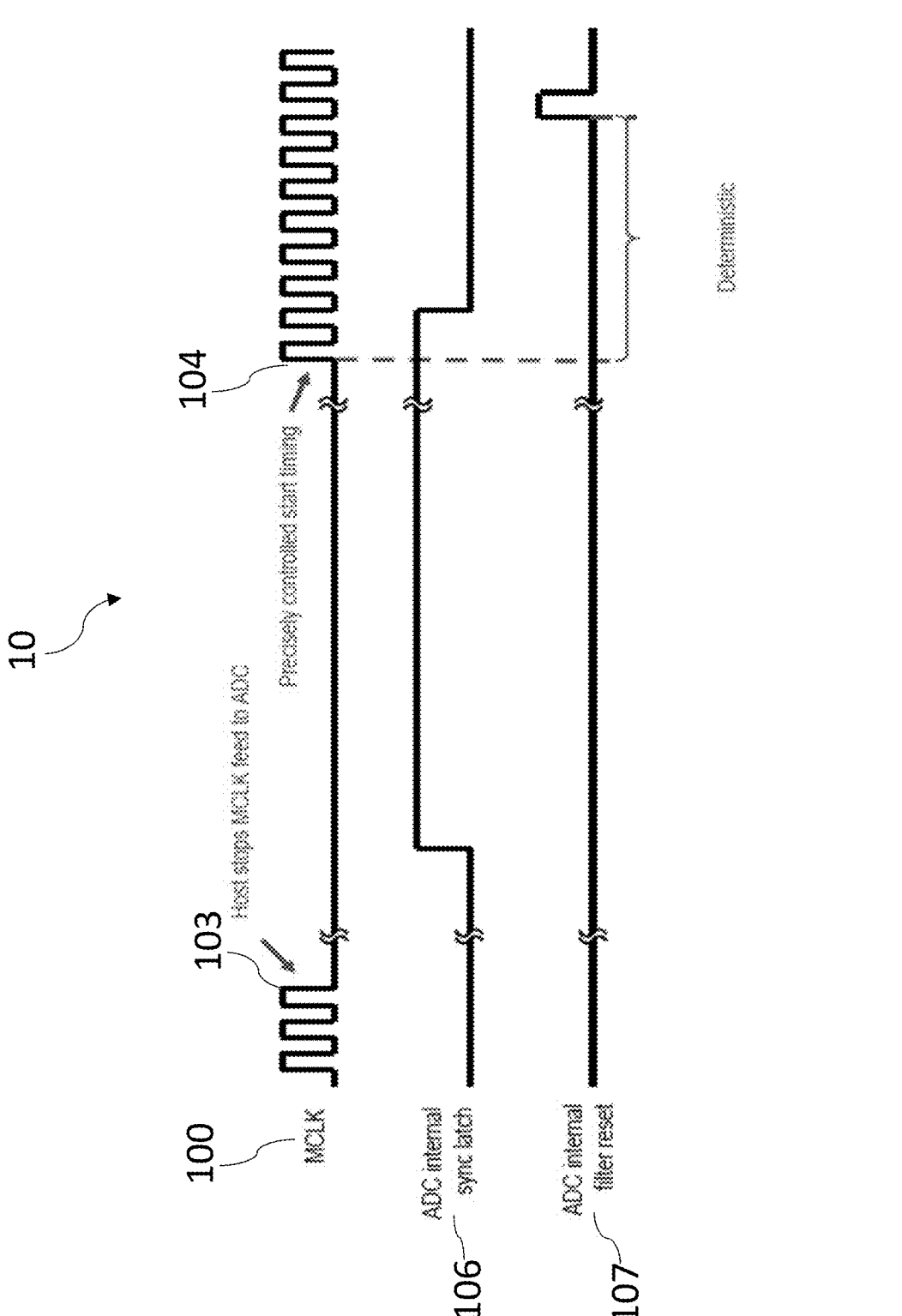
FIG. 10 shows an example timing diagram for use with the ADC system of FIG. 4b, in accordance with the present disclosure.

FIG. 10 relates to a further example timing diagram 10 for operating an ADC system. Example timing diagram 10 related to the ADC system 4b as shown in FIG. 4b, as the ADC system 4b comprises synchronization input/output signals that are coupled internally within the ADC.

The timing diagram 10 incorporates a master clock 100 signal, an ADC internal syn latch or ADC internal latch 106 and an ADC internal filter reset 107. Therefore, it can be seen that the main difference between example timing diagram 10 and example timing diagrams 7/8 is that there is no presence of the processor/host interface for receiving a synchronization event or command, similar to that of timing diagram 9. The ADC and the processor is still be coupled at an ADC interface, however, in this example, that interface is not used for receiving the synchronization event or a command associated with the synchronization event. Instead, the ADC detects the synchronization event automatically by detecting that the master clock has been stopped. Thus, it can be said, that example as described in relation to FIG. 10, performs auto-synchronization every time the ADC (or multiple ADCs) detects a stoppage in the master clock.

Example timing diagram 10 differs to that of example timing diagram 9 in that there is no presence of externally coupled synchronization input/output signal pins.

Therefore, in this example, the ADC system 4b operates as follows, in accordance with timing diagram 10.

The timing diagram 10 shows the master clock 100 is switched off at point 103. Thus, the master clock 100 for the ADC, or all associated ADCs, is turned off. Turning off the master clock 100 does not cause any issues for the standard ADC operation. The ADC is continuously checking the operation of the ADC to ensure that the master clock 100 is still operating in connection with the ADC. This may be achieved by polling the master clock pin on the ADC. When the ADC detects that the master clock 100 has stopped e.g. at point 103, then the ADC takes this as being an indication that a synchronization event has occurred. Therefore, the ADC does not restart sampling when the synchronization event is detected (by the master clock 100 being turned off), as the master clock 100 is switched off. During the master clock 100 off period, the ADC internal latch 106 switches in response to the detection of the synchronization event. Thus, at point 104 the master clock 100 is turned back on. Upon resumption of the master clock 100, the ADC internal latch 106 switches back and at deterministic time after this the ADC internal filter 97 resets. Since the ADC(s) within the system utilize the master clock 90 signal, the synchronized restart of the sampling of the ADC(s) occurs at a deterministic time after the restart of the master clock 100 and the reset of the ADC internal filter 107. If the master clock 100 is stopped and restarted with precise start timing in combination with the internal synchronization output signal/synchronization input signal mechanism, then precision sample synchronization is achieved relative to a reference time with only one master clock 100 signal.

FIG. 11 shows an example flow diagram 11 for operating an ADC system. Specifically, the flow diagram 11 is for operating an ADC system such as ADC system 4a (shown in FIG. 4a) in conjunction with the timing diagram 7 (shown in FIG. 7). The flow diagram 11 for operating an ADC system comprising an ADC, or multiple ADCs, may comprise of one or more of the following steps.

In s110, the ADC is continuously sampling e.g. the ADC is running normally and performing its normal operation. The master clock attached to the ADC is then turned off by a processor. Next, in s111, the ADC stops its normal operation e.g. the ADC stops sampling due to the master clock being switched off. During the master clock off time, s112 occurs wherein the ADC registers or detects a synchronization event or synchronization command. For example, the synchronization event or command may relate to an SPI command from an external processor or a trigger by toggling pin of the ADC, such as the ADC/processor interface pin. Following this, the processor resume sending the master clock signal to the ADC. The restart of the master clock occurs with precisely controlled start timing, as discussed previously. Next, at s113, the ADC generates a synchronization output signal which is synchronous to the master clock. The synchronization output signal is generated after a fixed number of master clock cycles after the master clock is restarted. In s114, the ADC registers the synchronization output signal at the synchronization input signal (since the synchronization output signal and the synchronization input signal are coupled) in the next master clock cycle. In s115, the ADC resets its internal filter after a fixed number of master clock cycles after receiving the synchronization input signal. In s116, the ADC restarts continuous sampling e.g. normal operation. The restarting of the ADC sampling occurs at the time equal to the master clock restarting time plus a fixed number of master clock cycles in response to the resetting of the internal filter in s115.

Figure 12:
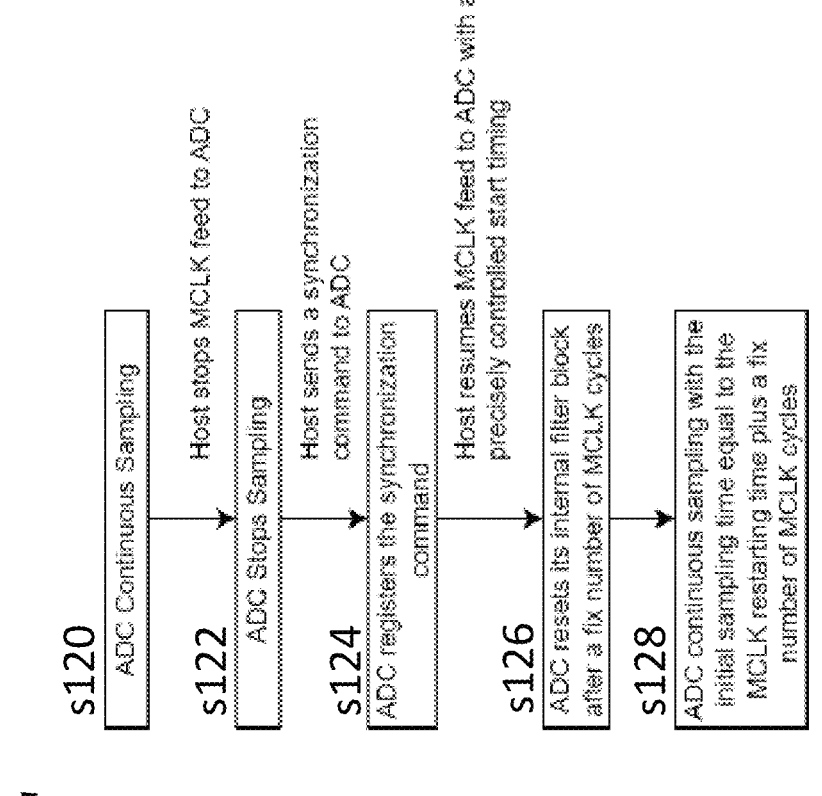
FIG. 12 shows an example flow diagram of the method of operating an ADC system such as ADC system 4b, in accordance with the present disclosure.

FIG. 12 shows an example flow diagram 12 for operating an ADC system. Specifically, the flow diagram 12 is for operating an ADC system such as ADC system 4b (shown in FIG. 4b) in conjunction with the timing diagram 8 (shown in FIG. 8). The flow diagram 12 for operating an ADC system comprising an ADC, or multiple ADCs, may comprise of one or more of the following steps.

In s120, the ADC is continuously sampling e.g. the ADC is running normally and performing its normal operation. The master clock attached to the ADC is then turned off by a processor. Next, in s122, the ADC stops its normal operation e.g. the ADC stops sampling due to the master clock being switched off. During the master clock off time, s124 occurs wherein the ADC registers or detects a synchronization event or synchronization command. For example, the synchronization event or command may relate to an SPI command from an external processor or a trigger by toggling pin of the ADC, such as the ADC/processor interface pin. Following this, the processor resumes the master clock to the ADC. The restart of the master clock occurs with precisely controlled start timing, as discussed previously. In s126, the ADC resets its internal filter block after a fixed number of master clock cycles after receiving the synchronization event or synchronization. This occurs because the internally coupled synchronization output and input signals performs the operations of s113-s114 of FIG. 11 internally. In s128, the ADC restarts continuous sampling e.g. normal operation. The restarting of the ADC sampling occurs at the time equal to the master clock restarting time plus a fixed number of master clock cycles, in response to the resetting of the internal filter in s126.

FIG. 13 shows an example flow diagram 13 for operating an ADC system. Specifically, the flow diagram 13 is for operating an ADC system such as ADC system 4a (shown in FIG. 4a) in conjunction with the timing diagram 9 (shown in FIG. 9). The flow diagram 13 is for operating an ADC system comprising and ADC, or multiple ADCs, and may comprise one or more of the following steps.

In s130, the ADC is continuously sampling e.g. the ADC is running normally and performing its normal operation. The master clock attached to the ADC is then turned off by a processor. Next, in s131, the ADC stops its normal operation e.g. the ADC stops sampling due to the master clock being switched off. During the master clock off time, s132 occurs wherein the ADC detects a synchronization event or synchronization command. For example, the synchronization event may relate to the ADC detecting the stoppage of the master clock and automatically considering this to be a synchronization event. The ADC may achieve this by continuously polling the master clock pin to ensure that the external master clock signal is still being received. Once the ADC detects the stopped master clock it acknowledges that a synchronization event has been detected by latching the internal latch of the ADC. Following this, the processor resumes the master clock to the ADC. The restart of the master clock occurs with precisely controlled start timing, as discussed previously. Next, at s133, the ADC generates a synchronization output signal which is synchronous to the master clock. The synchronization output signal is generated after a fixed number of master clock cycles after the master clock is restarted. In s134, the ADC registers the synchronization output signal at the synchronization input signal (since the synchronization output signal and the synchronization input signal are coupled) in the next master clock cycle. In s135, the ADC resets its internal filter block after a fixed number of master clock cycles after receiving the synchronization input signal. In s136, the ADC restarts continuous sampling e.g. normal operation. The restarting of the ADC sampling occurs at the time equal to the master clock restarting time plus a fixed number of master clock cycles, in response to the resetting of the internal filter in s135.

FIG. 14 shows an example flow diagram 14 for operating an ADC system. Specifically, the flow diagram 14 is for operating an ADC system such as ADC system 4b (shown in FIG. 4b) in conjunction with the timing diagram 10 (shown in FIG. 10). The flow diagram 14 is for operating an ADC system comprising and ADC, or multiple ADCs, and may comprise one or more of the following steps.

In s140, the ADC is continuously sampling e.g. the ADC is running normally and performing its normal operation. The master clock attached to the ADC is then turned off by a processor. Next, in s142, the ADC stops its normal operation e.g. the ADC stops sampling due to the master clock being switched off. During the master clock off time, s144 occurs wherein the ADC detects a synchronization event or synchronization command. For example, the synchronization event may relate to the ADC detecting the stoppage of the master clock and automatically considering this to be a synchronization event. The ADC may achieve this by continuously polling the master clock pin to ensure that the external master clock signal is still being received. Once the ADC detects the stopped master clock it acknowledges that a synchronization event has been detected by latching the internal latch of the ADC. Following this, the processor resumes the master clock to the ADC. The restart of the master clock will occur with precisely controlled start timing, as discussed previously. In s146, the ADC resets its internal filter block after a fixed number of master clock cycles after receiving the synchronization event or synchronization. This occurs because the internally coupled synchronization output and input signals performs the operations of s133-s134 of FIG. 13 internally. In s148, the ADC restarts continuous sampling e.g. normal operation. The restarting of the ADC sampling occurs at the time equal to the master clock restarting time plus a fixed number of master clock cycles, in response to the resetting of the internal filter in s146.

As mentioned previously in relation to the present disclosure i.e. the above-mentioned methods for performing synchronization of two or more ADCs is performed by a computer implemented system. The system may at least comprise at least one processor and at least one computer readable storage medium storing computer readable instructions that when executed by the processor cause the processor to at least: stop the shared master clock, the shared master clock being the master clock for the two or more ADCs to be synchronized; receive a command to trigger a synchronization output signal of a first ADC of the two or more ADCs whilst the shared master clock is stopped, wherein the synchronization output signal is synchronous to the shared master clock; and restart the shared master clock to synchronize the sampling of the two or more ADCs.

The above-mentioned systems for synchronizing two or more ADCs are comprised of: one or more processors, two or more ADCs, wherein the ADCs are configured such that a synchronization output signal of a first ADC is coupled to the associated synchronization input signal of all other ADCs and wherein the two or more ADC have a shared master clock and a memory device and a computer program code configured to, with the processor, perform a method according to the present disclosure.

This has the advantage of providing a system and method that can ensure robust and reliable sample synchronization in a multiple ADC system. It also has the further advantage of reducing the possibility of phase error between ADCs within the system. Moreover, this approach has the advantage of providing a system and method with reduced complexity, reduced hardware requirements, reduced points of failure, reduced costs, reduced hardware footprint etc. when compared to the existing systems and methods for synchronizing multiple ADCs.

Further, it can be said that the system and method enable the synchronization of multiple ADCs without the need for separate synchronization signals and without the need for isolation components. This feeds into the aforementioned advantages as it allows the system complexity to be reduced, reduces the hardware costs, limits the possible points of failure etc.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to."

The words "coupled" or "connected" or "tied", as generally used herein, refer to two or more elements or nodes that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

It will be understood that the above list is non-exhaustive, and that the method and system described herein is applicable to many technical problem domains to which machine learning models may be applied.

Various modifications, whether by addition, substitution, or deletion will be apparent to the intended reader to provide further examples of the present disclosure, any and all of which are intended to be encompassed by the appended claims.

Numbered Aspects

By way of non-limiting example, some aspects of the disclosure are set out in the following numbered clauses.

Numbered Clause 1: A method for synchronizing an analog-to-digital converter, ADC, the method comprising:

stopping, by a processor, a master clock signal to the ADC to pause sampling of the ADC, the master clock being supplied by an external master clock to the ADC;

detecting, by the ADC, that a synchronization event has occurred whilst the master clock is stopped;

restarting, by the processor, the master clock signal to the ADC;

resetting, by the ADC, an internal filter at a time that is synchronous with the master clock; and resuming, by the ADC, sampling in response to resetting the internal filter of the ADC.

Numbered Clause 2a: The method of Numbered Clause 1, wherein resetting an internal filter comprises holding the internal filter in a reset state until the resuming of the sampling has occurred. Preferably, the internal filter is held for a fixed number of master clock cycles following restarting of the master clock. Preferably, the resetting of the internal filter, by the ADC, is executed following the detecting, by the ADC, that the synchronization event has occurred.

Numbered Clause 2b: The method of Numbered Clause 1, wherein resetting an internal filter comprises a first change of state of the internal filter at a time that is synchronous with the master clock and a second change of state of the internal filter at a time that is synchronous with the master clock, wherein the first change of state is opposite to the second change of state and wherein the second change of state occurs after a fixed number of master clock cycles following the first change of state. Preferably, the resetting of the internal filter, by the ADC, is executed following the detecting, by the ADC, that the synchronization event has occurred.

Numbered Clause 3: The method of Numbered Clause 2b, wherein resuming sampling of the ADC comprises resuming sampling in response to the second change of state of the internal filter of the ADC.

Numbered Clause 4: The method of any preceding Numbered Clause, wherein resuming sampling of the ADC comprises resuming sampling after a fixed number of master clock cycles following restarting of the master clock. Said fixed number of master clock cycles for resuming sampling of the ADC following restarting of the master clock may be the same or different to the fixed number of master clock cycles of holding the internal filter in a reset state following restarting of the master clock. Preferably, the internal filter may be held in a reset state for a fewer number of clock cycles than the number of master clock cycles for resuming sampling of the ADC following restarting of the master clock.

Numbered Clause 5: The method of any of Numbered Clauses 1 to 4, wherein detecting, by the ADC, the synchronization event comprises receiving a command from the processor indicating that synchronization is requested and latching a synchronization event trigger of the ADC.

Numbered Clause 6: The method of any of Numbered Clauses 1 to 4, wherein detecting, by the ADC, the synchronization event comprises detecting, by an internal clock of the ADC, that the master clock has stopped and latching a synchronization event trigger of the ADC.

Numbered Clause 7: The method of any preceding Numbered Clause, wherein restarting, by the processor, the master clock signal to the ADC comprises restarting the master clock signal at a precisely controlled time.

Numbered Clause 8: The method of any preceding Numbered Clause, wherein the method further comprises:

generating, by the ADC, a synchronization output signal at a synchronization output of the ADC, the synchronization output signal being synchronous with the master clock.

Numbered Clause 9: The method of Numbered Clause 8, wherein the method further comprises:

registering, by the ADC, the synchronization output signal at a synchronization input of the ADC after a fixed number of master clock cycles.

Numbered Clause 10: The method of Numbered Clause 9, wherein the synchronization output and the synchronization input of the ADC are coupled via external pins of the ADC and wherein the method further comprises:

resetting the internal filter of the ADC after a fixed number of master clock cycles of registering the synchronization output signal at an synchronization input of the ADC.

Numbered Clause 11: The method of Numbered Clause 9, wherein the synchronization output and the synchronization input of the ADC are coupled via internal logic circuitry of the ADC.

Numbered Clause 12: The method of any preceding Numbered Clause, wherein resetting, by the ADC, an internal filter at a time that is synchronous with the master clock comprises resetting with respect to a time reference from the master clock. Preferably, the resetting of the internal filter, by the ADC, is executed following the detecting, by the ADC, that the synchronization event has occurred.

Numbered Clause 13: The method of Numbered Clause 12, wherein resuming, by the ADC, sampling in response to resetting the internal filter of the ADC comprises resuming with respect to the time reference.

Numbered Clause 14: The method of any preceding Numbered Clause, wherein the method further comprises monitoring, by the processor, that sampling of the ADC the master clock is restarted is synchronous with the master clock.

Numbered Clause 15: The method of any preceding Numbered Clause, wherein the method of stopping the master clock, restarting the master clock and/or restarting sampling of the ADC is performed by a Field Programmable Gate Array, FPGA, or a processor such as a Microcontroller Unit, MCU.

Numbered Clause 16: A method for synchronizing two or more analog-to-digital converters, ADCs, the method comprising:

stopping, by a processor, a shared master clock signal to two or more ADCs to pause sampling of the two or more ADCs, the shared master clock being supplied by an external master clock to the two or more ADCs;

detecting, by each of the two or more ADCs, that a synchronization event has occurred whilst the shared master clock is stopped;

restarting, by the processor, the shared master clock signal to each of the two or more ADCs;

resetting, by each of the two or more ADCs, an internal filter at a time that is synchronous with the master clock; and resuming, by the two or more ADC, sampling in response to resetting their respective internal filters.

Numbered Clause 17a: The method of Numbered Clause 16, wherein resetting an internal filter comprises holding the internal filter in a reset state until the resuming of the sampling has occurred. Preferably, the resetting of the internal filter, by the ADC, is executed following the detecting, by the ADC, that the synchronization event has occurred.

Numbered Clause 17b: The method of Numbered Clause 16, wherein resetting an internal filter comprises a first change of state of the internal filter at a time that is synchronous with the master clock and a second change of state of the internal filter at a time that is synchronous with the master clock, wherein the first change of state is opposite to the second change of state and wherein the second change of state occurs after a fixed number of master clock cycles following the first change of state. Preferably, the resetting of the internal filter, by the ADC, is executed following the detecting, by the ADC, that the synchronization event has occurred.

Numbered Clause 18: The method of Numbered Clause 17b, wherein resuming sampling of the two or more ADC comprises resuming sampling in response to the second change of state of the internal filter of the two or more ADCs.

Numbered Clause 19: The method of any of Numbered Clauses 16 to 18, wherein resuming sampling of the two or more ADCs comprises resuming sampling after a fixed number of master clock cycles after the master clock is restarted.

Numbered Clause 20: The method of any of Numbered Clauses 16 to 19, wherein detecting, by each of the two or more ADCs, the synchronization event comprises receiving a command from the processor indicating that synchronization is requested.

Numbered Clause 21: The method of any of Numbered Clauses 16 or 19, wherein detecting, by each of the two or more ADCs, the synchronization event comprises detecting, by an internal clock of the two or more ADCs, that the master clock has stopped and latching a synchronization event trigger of the two or more ADCs.

Numbered Clause 22: The method of any of Numbered Clauses 16 to 21, wherein restarting, by the processor, the master clock signal to each of the two or more ADCs comprises restarting the master clock signal at a precisely controlled time.

Numbered Clause 23: The method of any of Numbered Clauses 16 to 22, wherein the method further comprises:

generating, by each of the two or more ADCs, a synchronization output signal at a synchronization output of each of the two or more ADCs, the synchronization output signal being synchronous with the master clock.

Numbered Clause 24: The method of Numbered Clause 23, wherein the method further comprises:

registering, by each of the two or more ADCs, the synchronization output signal at a synchronization input of each of the two or more ADCs after a fixed number of master clock cycles.

Numbered Clause 25: The method of Numbered Clause 24, wherein the synchronization output and the synchronization input of each of the two or more ADCs are coupled via external pins of each of the two or more ADCs and wherein the method further comprises:

resetting the internal filter of each of the two or more ADCs after a fixed number of master clock cycles of registering the synchronization output signal at an synchronization input of the two or more ADCs.

Numbered Clause 26: The method of Numbered Clause 24, wherein the synchronization output and the synchronization input of each of the two or more ADCs are coupled via internal logic circuitry of the ADC.

Numbered Clause 27: The method of any of Numbered Clauses 16 to 27, wherein resetting, by each of the two or more ADCs, an internal filter at a time that is synchronous with the master clock comprises resetting with respect to a time reference from the master clock. Preferably, the resetting of the internal filter, by the ADC, is executed following the detecting, by the ADC, that the synchronization event has occurred.

Numbered Clause 28: The method of Numbered Clause 27, wherein resuming, by each of the two or more ADCs, sampling in response to resetting the internal filter of each of the two or more ADCs comprises resuming with respect to the time reference.

Numbered Clause 29: The method of any of Numbered Clauses 16 to 28, wherein the method further comprises monitoring, by the processor, that sampling of the two or more ADCs the master clock is restarted is synchronous with the master clock.

Numbered Clause 30: The method of any of Numbered Clauses 16 to 29, wherein the method of stopping the master clock, restarting the master clock and/resuming sampling of the two or more ADCs is performed by a Field Programmable Gate Array, FPGA, or a processor such as a Microcontroller Unit, MCU.

Numbered Clause 31: An analog-to-digital converter, ADC, system, the system comprising:

an ADC comprising an internal filter;

a master clock, the master clock being external to and coupled with the ADC and a processor, the processor being external to and coupled with the ADC and the master clock; and a memory and a computer program code stored thereon, wherein the computer program code that, when executed by the processor, causes:

stopping, by a processor, a master clock signal to the ADC to pause sampling of the ADC, the master clock being supplied by the external master clock to the ADC;

detecting, by the ADC, that a synchronization event has occurred whilst the master clock is stopped;

restarting, by the processor, the master clock signal to the ADC;

resetting, by the ADC, the internal filter at a time that is synchronous with the master clock; and resuming, by the ADC, sampling in response to resetting the internal filter of the ADC.

Numbered Clause 32: The system of Numbered Clause 31, wherein the ADC comprises a command trigger interface for receiving a command from the processor indicating that the master clock has stopped and latching a synchronization event trigger of the two or more ADCs.

Numbered Clause 33: The system of Numbered Clause 31, wherein the ADC comprises an internal clock for detecting the synchronization event and for latching a synchronization event trigger of the ADC.

Numbered Clause 34: The system of any of Numbered Clauses 31 to 33, wherein the ADC comprises an external synchronization output signal pin and an external synchronization input signal pin, and the synchronization output signal pin is coupled to the synchronization input signal pin.

Numbered Clause 35: The system of any of Numbered Clauses 31 to 34, wherein the ADC comprises internal logic circuitry for coupling the synchronization output and the synchronization input of the ADC.

Numbered Clause 36: The system of any of Numbered Clauses 31 to 35, wherein the processor is a Field Programmable Gate Array, FPGA, or a Microcontroller Unit, MCU.

Numbered Clause 37: The system of any of Numbered Clauses 31 to 36, wherein the system comprises two or more ADCs, the two or more ADCs being arranged such that each of the two or more ADCs are coupled to the processor and the shared master clock, respectively.

The invention claimed is:

1. A method for synchronizing an analog-to-digital converter, ADC, the method comprising:

stopping, by a processor, a master clock signal to the ADC to pause sampling of the ADC, the master clock signal being supplied by an external master clock to the ADC;

detecting, by the ADC, that a synchronization event has occurred whilst the master clock is stopped;

restarting, by the processor, the master clock signal to the ADC;

resetting, by the ADC, an internal filter, at a time that is synchronous with the master clock; and resuming, by the ADC, sampling in response to resetting the internal filter of the ADC.

2. The method of claim 1, wherein resetting an internal filter comprises holding the internal filter in a reset state until the resuming of the sampling has occurred.

3. The method of claim 1, wherein resuming sampling of the ADC comprises resuming sampling after a fixed number of master clock cycles following restarting of the master clock.

4. The method of claim 1, wherein the detecting, by the ADC, the synchronization event comprises one or more of:

receiving a command from the processor indicating that synchronization is requested and latching a synchronization event trigger of the ADC; and detecting, by an internal clock of the ADC, that the master clock has stopped and latching a synchronization event trigger of the ADC.

5. The method of claim 1, wherein restarting, by the processor, the master clock signal to the ADC comprises restarting the master clock signal at a precisely controlled time.

6. The method of claim 4, wherein the method further comprises:

generating, by the ADC, a synchronization output signal at a synchronization output of the ADC, the synchronization output signal being synchronous with the master clock; and registering, by the ADC, the synchronization output signal at a synchronization input of the ADC after a fixed number of master clock cycles.

7. The method of claim 6, wherein the synchronization output and the synchronization input of the ADC are coupled via external pins of the ADC and wherein the method further comprises:

resetting the internal filter of the ADC after a fixed number of master clock cycles of registering the synchronization output signal at a synchronization input of the ADC.

8. The method of claim 6, wherein the synchronization output and the synchronization input of the ADC are coupled via internal logic circuitry of the ADC.

9. The method of claim 1, wherein resetting, by the ADC, an internal filter at a time that is synchronous with the master clock comprises resetting with respect to a time reference from the master clock.

10. A method for synchronizing two or more analog-to-digital converters, ADCs, the method comprising:

stopping, by a processor, a shared master clock signal to two or more ADCs to pause sampling of the two or more ADCs, the shared master clock signal being supplied by an external master clock to the two or more ADCs;

detecting, by each of the two or more ADCs, that a synchronization event has occurred whilst the shared master clock is stopped;

restarting, by the processor, the shared master clock signal to each of the two or more ADCs;

resetting, by each of the two or more ADCs, an internal filter at a time that is synchronous with the master clock; and resuming, by the two or more ADCs, sampling in response to resetting their respective internal filters.

11. The method of claim 10, wherein resetting an internal filter comprises holding the internal filter in a reset state until the resuming of the sampling has occurred.

12. The method of claim 10, wherein resuming sampling of the two or more ADCs comprises resuming sampling after a fixed number of master clock cycles following the restarting of the master clock.

13. The method of claim 10, wherein detecting, by each of the two or more ADCs, the synchronization event comprises one or more of:

receiving a command from the processor indicating that synchronization is requested and latching a synchronization event trigger of the two or more ADCs; and detecting, by an internal clock of the two or more ADCs, that the master clock has stopped and latching a synchronization event trigger of the two or more ADCs.

14. The method of claim 10, wherein restarting, by the processor, the master clock signal to each of the two or more ADCs comprises restarting the master clock signal at a precisely controlled time.

15. The method of claim 13, wherein the method further comprises:

generating, by each of the two or more ADCs, a synchronization output signal at a synchronization output of each of the two or more ADCs, the synchronization output signal being synchronous with the master clock; and registering, by each of the two or more ADCs, the synchronization output signal at a synchronization input of each of the two or more ADCs after a fixed number of master clock cycles.

16. The method of claim 15, wherein the synchronization output and the synchronization input of each of the two or more ADCs are coupled via external pins of each of the two or more ADCs and wherein the method further comprises:

resetting the internal filter of each of the two or more ADCs after a fixed number of master clock cycles of registering the synchronization output signal at a synchronization input of the two or more ADCs.

17. The method of claim 15, wherein the synchronization output and the synchronization input of each of the two or more ADCs are coupled via internal logic circuitry.

18. The method of claim 10, wherein resetting, by each of the two or more ADCs, an internal filter at a time that is synchronous with the master clock comprises resetting with respect to a time reference from the master clock.

19. An analog-to-digital converter, ADC, system, the system comprising:

an ADC comprising an internal filter;

a master clock, the master clock being external to and coupled with the ADC and a processor, the processor being external to and coupled with the ADC and the master clock; and a memory and a computer program code stored thereon, wherein the computer program code that, when executed by the processor, causes:

stopping, by a processor, a master clock signal to the ADC to pause sampling of the ADC, the master clock signal being supplied by the external master clock to the ADC;

detecting, by the ADC, that a synchronization event has occurred whilst the master clock is stopped;

restarting, by the processor, the master clock signal to the ADC;

resetting, by the ADC, the internal filter at a time that is synchronous with the master clock; and resuming, by the ADC, sampling in response to resetting the internal filter of the ADC.

20. The system of claim 19, wherein the system comprises two or more ADCs, the two or more ADCs being arranged such that each of the two or more ADCs are coupled to the processor and a shared master clock, respectively.

* * * * *